US012745671B2

(12) United States Patent
Cha

(10) Patent No.: US 12,745,671 B2
(45) Date of Patent: Sep. 22, 2026

(54) DISPLAY DEVICE HAVING FIRST AND SECOND ORGANIC PLANARIZATION LAYERS WITH RESPECTIVE FIRST AND SECOND OPENINGS THEREIN THAT ARE NOT ALIGNED WITH EACH OTHER AND EXPOSE A CONDUCTIVE PATTERN

(71) Applicant: Samsung Display Co., Ltd., Yongin-si (KR)

(72) Inventor: Jong Hwan Cha, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 938 days.

(21) Appl. No.: 17/449,909

(22) Filed: Oct. 4, 2021

(65) Prior Publication Data

US 2022/0208901 A1 Jun. 30, 2022

(30) Foreign Application Priority Data

Dec. 28, 2020 (KR) ........................ 10-2020-0184645

(51) Int. Cl.
*H10W 90/00* (2026.01)
*H10K 59/122* (2023.01)
(Continued)

(52) U.S. Cl.
CPC .......... *H10W 90/00* (2026.01); *H10K 59/122* (2023.02); *H10K 59/124* (2023.02); *H10K 59/131* (2023.02)

(58) Field of Classification Search
CPC .. H10K 59/122; H10K 50/844; H10K 59/124; H10K 59/131; H10K 59/123;
(Continued)

(56) References Cited

U.S. PATENT DOCUMENTS 8,895,968 B2 11/2014 Jeong
10,461,123 B2 10/2019 Kim et al.
(Continued)

FOREIGN PATENT DOCUMENTS

CN 211929490 U 11/2020
KR 10-1407310 B1 6/2014
(Continued)

*Primary Examiner* — Davienne N Monbleau
*Assistant Examiner* — John Patrick Cornely
(74) *Attorney, Agent, or Firm* — Womble Bond Dickinson (US) LLP

(57) ABSTRACT

A display device includes: a substrate; a first conductive layer on the substrate and including a conductive pattern electrically connected to a first transistor; a first organic planarization layer on the first conductive layer; an organic layer on the first organic planarization layer and including a first bank having a first height and a second organic planarization layer having a second height lower than the first height; a first electrode on the organic layer; a second electrode on the organic layer and spaced apart from the first electrode; and a light-emitting element between the first electrode and the second electrode. The first organic planarization layer has a first opening exposing the conductive pattern, and the second organic planarization layer has a second opening exposing the conductive pattern. Sidewalls of the first opening and sidewalls of the second opening are not aligned in line with each other.

19 Claims, 31 Drawing Sheets

(51) Int. Cl.
*H10K 59/124* (2023.01)
*H10K 59/131* (2023.01)

(58) Field of Classification Search
CPC ..... H01L 33/24; H01L 33/62; H01L 25/0753; H01L 33/08; H01L 25/167; H01L 27/1214; H10H 20/821; H10H 20/857; H10H 20/813; H10D 86/40; H10W 90/00
See application file for complete search history.

(56) References Cited

U.S. PATENT DOCUMENTS

| | | | | |
|---|---|---|---|---|
| 10,658,605 | B2 | 5/2020 | Lee et al. | |
| 11,581,363 | B2 | 2/2023 | Kim et al. | |
| 12,119,372 | B2 | 10/2024 | Kim et al. | |
| 12,238,979 | B2 | 2/2025 | Yang et al. | |
| 12,300,766 | B2 | 5/2025 | Im et al. | |
| 2018/0122882 | A1* | 5/2018 | Lee | H01L 27/1248 |
| 2018/0175106 | A1 | 6/2018 | Kim et al. | |
| 2020/0328269 | A1* | 10/2020 | Shin | H10K 59/124 |
| 2021/0013186 | A1* | 1/2021 | Chen | H01L 25/0753 |
| 2022/0359632 | A1* | 11/2022 | Yang | H10K 50/844 |
| 2025/0040330 | A1 | 1/2025 | Kim et al. | |
| 2025/0366267 | A1 | 11/2025 | Im et al. | |
| 2025/0386669 | A1 | 12/2025 | Yang et al. | |

FOREIGN PATENT DOCUMENTS

| | | | |
|---|---|---|---|
| KR | 10-2018-0072909 | A | 7/2018 |
| KR | 10-2019-0029831 | A | 3/2019 |
| KR | 10-2019-0081213 | A | 7/2019 |
| KR | 10-2020-0034896 | A | 4/2020 |
| KR | 10-2020-0138479 | A | 12/2020 |

* cited by examiner

110: VDL, BML, CSE1, VIL, DTL
120: ACT1, ACT2
130: GE1, GE2, CSE2
140: SD1,SD2, SD3, CSE3, SD4, CDP, VSL

FIG. 14

110: VDL, BML, CSE1, VIL, DTL
120: ACT1, ACT2
130: GE1, GE2, CSE2
140: SD1,SD2, SD3, CSE3, SD4, CDP, VSL

FIG. 21

110: VDL, BML, CSE1, VIL, DTL
120: ACT1, ACT2
130: GE1, GE2, CSE2
140: SD1, SD2, SD3, CSE3, SD4, CDP, VSL
141: SD2, SD3, CSE3

FIG. 25

410_1
(400_1)
CDP(140)
165
CT1_1
HA1_1
HA2_1
w1
w2
DR2
DR1
DR3

110: VDL, BML, CSE1, VIL, DTL
120: ACT1, ACT2
130: GE1, GE2, CSE2
140: SD1, SD2, SD3, CSE3, SD4, CDP, VSL
141: SD2, SD3, CSE3

FIG. 30

CT1
CDP(140)
165
HA1
410
HA2
DR2
DR1
DR3

DISPLAY DEVICE HAVING FIRST AND SECOND ORGANIC PLANARIZATION LAYERS WITH RESPECTIVE FIRST AND SECOND OPENINGS THEREIN THAT ARE NOT ALIGNED WITH EACH OTHER AND EXPOSE A CONDUCTIVE PATTERN

CROSS-REFERENCE TO RELATED APPLICATION

This application claims priority to and the benefit of Korean Patent Application No. 10-2020-0184645, filed on Dec. 28, 2020, in the Korean Intellectual Property Office, the disclosure of which is incorporated herein by reference in its entirety.

BACKGROUND

1. Field

Aspects of embodiments of the present disclosure relate to a display device.

2. Description of Related Art

Display devices are becoming more and more important as multimedia technology evolves. Accordingly, a variety of types of display devices, such as organic light-emitting diode (OLED) display devices and liquid-crystal display (LCD) devices, are currently used.

Display devices generally include a display panel, such as an organic light-emitting display panel and a liquid-crystal display panel, for displaying images. Among the types of display panels, a light-emitting display panel may include light-emitting elements. For example, light-emitting diodes (LEDs) may include an organic light-emitting diode (OLED) using an organic material as a luminescent material and an inorganic light-emitting diode using an inorganic material as a luminescent material.

SUMMARY

Embodiments of the present disclosure provide a display device with improved reliability.

It should be noted that aspects and features of the present disclosure are not limited to the above-mentioned aspect and feature; and other aspects and features of the present disclosure will be apparent to those skilled in the art from the following description.

According to an embodiment of the present disclosure, a display device includes: a substrate; a first conductive layer on the substrate and including a conductive pattern electrically connected to a first transistor; a first organic planarization layer on the first conductive layer; an organic layer on the first organic planarization layer, the organic layer including a first bank having a first height and a second organic planarization layer having a second height lower than the first height; a first electrode on the organic layer; a second electrode on the organic layer and spaced apart from the first electrode; and a light-emitting element between the first electrode and the second electrode. The first organic planarization layer has a first opening exposing the conductive pattern therethrough, the second organic planarization layer has a second opening exposing the conductive pattern therethrough, and sidewalls of the first organic planarization layer defining the first opening and sidewalls of the second organic planarization layer defining the second opening are not aligned in line with each other.

The second opening may overlap at least a part of the first opening in a thickness direction of the substrate.

A diameter or width of the second opening may be smaller than a diameter or width of the first opening.

The second organic planarization layer may cover the sidewalls of the first organic planarization layer defining the first opening and an upper surface of the first organic planarization layer.

An inclination angle of the sidewalls of the second organic planarization layer defining the second opening may be greater than an inclination angle of the sidewalls of the first organic planarization layer defining the first opening.

The first electrode may be electrically connected to the conductive pattern through the second opening.

A diameter or width of the second opening may be larger than a diameter or width of the first opening.

The sidewalls of the second organic planarization layer defining the second opening may be on an upper surface of the first organic planarization layer.

The first electrode may be electrically connected to the conductive pattern through the first opening and the second opening.

The second opening may expose the first opening and a part of an upper surface of the first organic planarization layer.

A diameter or width of the second opening may be equal to a diameter or width of the first opening.

The second opening may deviate from the first opening in a direction when viewed from top.

An inclination angle of the sidewalls of the first organic planarization layer defining the first opening may be different from an inclination angle of the sidewalls of the second organic planarization layer defining the second opening.

The first electrode may be electrically connected to the conductive pattern through an electrode contact opening exposing the conductive pattern.

The electrode contact opening may be formed by the first opening or the second opening.

The organic layer may be directly on an upper surface of the first organic planarization layer.

The display device may further include a passivation layer on the first organic planarization layer and having a third opening exposing the conductive pattern. The organic layer may be on the passivation layer.

Sidewalls of the passivation layer defining the third opening may be aligned in line with the sidewalls of the first organic planarization layer defining the first opening.

The display device may further include: a second conductive layer on the substrate and including a first capacitor electrode; a buffer layer on the second conductive layer; a third conductive layer on the buffer layer and including a second capacitor electrode overlapping the first capacitor electrode in a thickness direction of the substrate; and an interlayer insulating film on the third conductive layer. The first conductive layer may be on the interlayer insulating film, and the first conductive layer may further include a third capacitor electrode overlapping the first capacitor electrode and the second capacitor electrode in the thickness direction of the substrate.

The first organic planarization layer and the second organic planarization layer may be interposed between the first electrode and the third capacitor electrode.

The details of one or more embodiments described in this specification are set forth in the accompanying drawings and the description below.

A display device according to an embodiment of the present disclosure may include an organic layer including the first organic planarization layer, a second organic planarization layer, and a first bank to compensate for surface level differences that may occur in regions where a plurality of conductive layers overlap each other. The second organic planarization layer may have a first height, the first bank may have a second height higher than the first height, and the second organic planarization layer and the first bank be formed via a single mask process. Accordingly, because the first bank and the second organic planarization layer are formed via a single mask process, and the second organic planarization layer is further provided as an organic film interposed between the first and second electrodes and the third conductive layer, the thickness of the organic film between the first and second electrodes and the third conductive layer can be supplemented, which may otherwise be reduced due to the thickness of the first organic planarization layer being reduced during the process of forming the contact openings (or contact holes) penetrating the passivation layer. In this manner, a short-circuit or coupling between the first and second electrodes and the third conductive layer may be prevented or substantially prevented. Accordingly, the reliability of the display device can be improved.

It should be noted that aspects and features of the present disclosure are not limited to those described above, and other aspects and features of the present disclosure will be apparent to those skilled in the art from the following description.

BRIEF DESCRIPTION OF THE DRAWINGS

The above and other aspects and features of the present disclosure will become more apparent by describing, in detail, embodiments thereof with reference to the attached drawings, in which:

FIG. 9 is an enlarged, cross-sectional view showing an example of the area A of FIG. 5.

FIGS. 11 to 22 are cross-sectional views showing processing steps of a method of fabricating the display device shown in FIG. 5.

FIG. 25 is a plan view showing a layout of a peripheral area around a first opening and a second opening forming a first electrode contact opening shown in FIG. 24.

FIG. 27 is a plan view showing a layout of a peripheral area around a first opening and a second opening forming a first electrode contact opening shown in FIG. 26.

FIG. 28 is a cross-sectional view of a display device according to another embodiment of the present disclosure.

FIG. 30 is a plan view showing a layout of a peripheral area around a first opening and a second opening forming a first electrode contact opening according to another embodiment.

DETAILED DESCRIPTION

Figure 1:
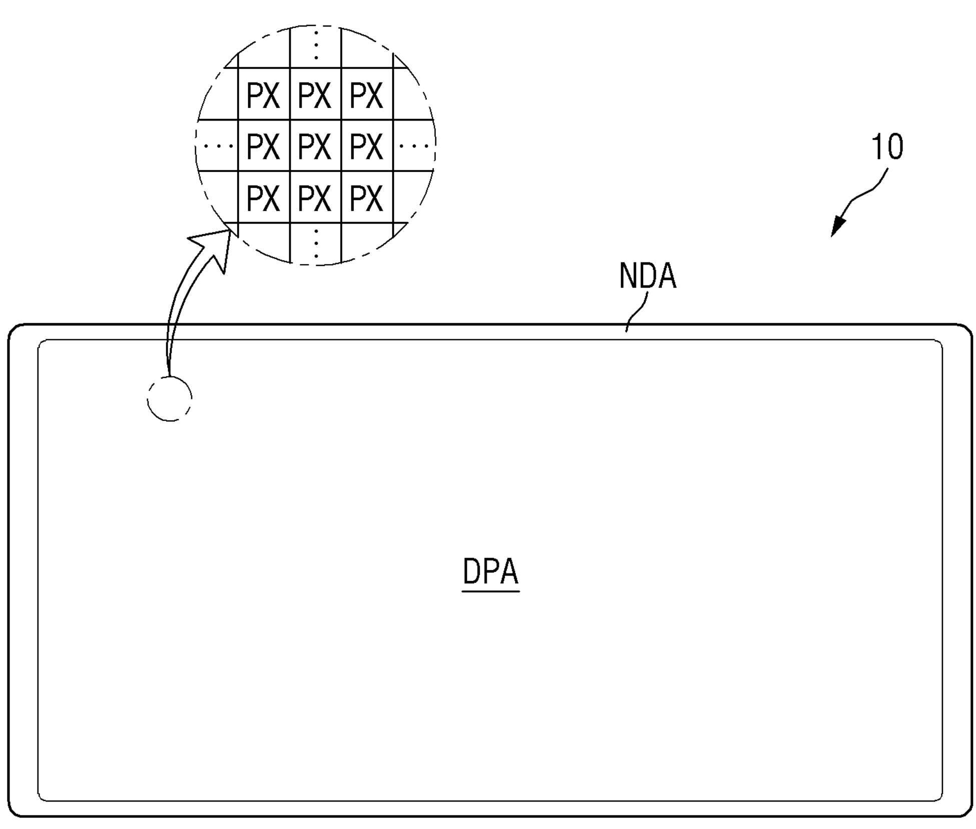
FIG. 1 is a plan view of a display device according to an embodiment of the present disclosure.
Figure 1:
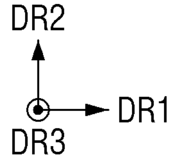

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will filly convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described with reference to the accompanying drawings.

FIG. 1 is a plan view of a display device according to an embodiment of the present disclosure.

Referring to FIG. 1, a display device 10 displays a moving image or a still image. The display device 10 may be any electronic device that provides (or includes) a display screen. For example, the display device 10 may be a television set, a laptop computer, a monitor, an electronic billboard, an Internet of Things (IoT) device, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 10 includes a display panel providing a display screen. Examples of the display panel may include an inorganic light-emitting diode display panel, an organic light-emitting display panel, a quantum-dot light-emitting display panel, a plasma display panel, a field emission display panel, etc. In the following description, the display device 10 is described as an inorganic light-emitting diode display panel as an example, but the present disclosure is not limited thereto. Any other suitable display panel may be employed as long as the technical idea of the present disclosure can be equally applied.

A first direction DR1, a second direction DR2, and a third direction DR3 are defined in the drawings. The display device 10 according to the embodiments of the present disclosure will be described with reference to the drawings. The first direction DR1 may be perpendicular to the second direction DR2 in a plane The third direction DR3 may be perpendicular to the plane in which the first direction DR1 and the second direction DR2 are located. The third direction DR3 may be perpendicular to each of the first direction DR1 and the second direction DR2. In the following description of the display device 10 according to the embodiments of the present disclosure, the third direction DR3 refers to the thickness direction (e.g., the display side or display direction) of the display device 10.

The display device 10 may have a rectangular shape having longer sides in the first direction DR1 and shorter sides in the second direction DR2 when viewed from the top. Although the corners at where the longer sides and the shorter sides of the display device 10 meet may form a right angle, this is merely illustrative. The display device 10 may have rounded corners. The shape of the display device 10 is not limited to that shown and may be modified in a variety of suitable ways. For example, the display device 10 may have other shapes, such as a square, a rectangle with rounded corners (vertices), other polygons, and a circle.

A display surface may be located on one side of the display device 10 in the third direction DR3 (e.g., the thickness direction). In the following description, the upper side of the display device 10 refers to the side in the third direction DR3 at where images are displayed, and the upper surface of the display device 10 refers to the surface facing the side in the third direction DR3, unless specifically stated otherwise. In addition, the lower side refers to the opposite side in the third direction DR3, and likewise, the lower surface refers to the surface facing the opposite side in the third direction DR3. As used herein, the terms "left," "right," "upper," and "lower" sides refer to relative positions when the display device 10 is viewed from the top. For example, the right side refers to one side in the first direction DR1, the left side refers to the opposite side in the first direction DR1, the upper side refers to one side in the second direction DR2, and the lower side refers to the opposite side in the second direction DR2.

The display device 10 may have a display area DPA and a non-display area NDA. Images can be displayed in the display area DPA. Images are not displayed In the non-display area NDA.

The shape of the display area DPA may follow (or correspond to) the shape of the display device 10. For example, the display area DPA may have a rectangular shape generally similar to the shape of the display device 10 when viewed from the top. The display area DPA may generally occupy the majority of the center of the display device 10.

The display area DPA may include a plurality of pixels PX. The plurality of pixels PX may be arranged in a matrix. The shape of each of the pixels PX may be rectangular or square when viewed from the top. In an embodiment, each of the pixels PX may include a plurality of light-emitting elements including (or made of) inorganic particles.

The non-display area NDA may be disposed around the display area DPA.

The non-display area NDA may entirely or partially surround (e.g., may entirely or partially extend around a periphery of) the display area DPA. The non-display area NDA may form the bezel of the display device 10.

Figure 2:
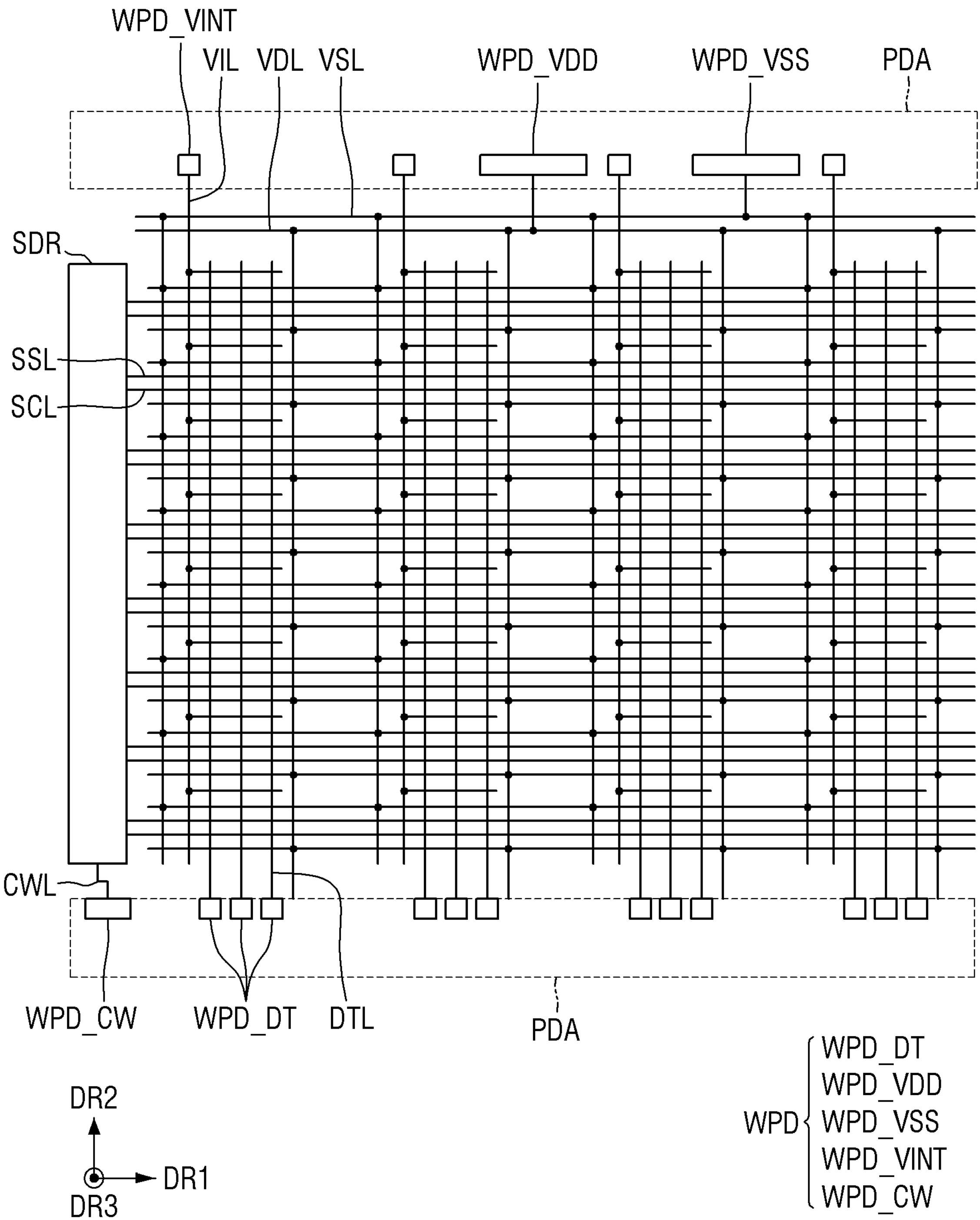
FIG. 2 is a schematic layout diagram showing lines included in a display device according to an embodiment of the present disclosure.

FIG. 2 is a schematic layout diagram showing lines included in a display device according to an embodiment of the present disclosure.

Referring to FIG. 2, the display device 10 may include a plurality of lines. The plurality of lines may be included in a circuit element layer CCL (see, e.g., FIG. 5), which will be described later. The plurality of lines may include a scan line SCL, a sensing line SSL, a data line DTL, an initialization voltage line VIL, a first voltage line VDL, a second voltage line VSL, etc. Other lines may also be further disposed in the display device 10.

As used herein, when an element is referred to as being "connected" or "coupled" to another element, it can be directly connected or coupled to the element or intervening elements may be present. In addition, such elements may be understood as a single integrated element, and thus, one portion thereof is connected to another portion. Moreover, when an element is referred to as being "connected" to another element, it may be in direct contact with the element and also electrically connected to the element.

The scan line SCL and the sensing line SSL may be extended in (or may extend in) the first direction DR1. The scan line SCL and the sensing line SSL may be connected to a scan driver SDR. The scan driver SDR may include a driving circuit. The scan driver SDR may be disposed in the non-display area NDA. According to an embodiment of the present disclosure, the scan driver SDR may be disposed in the non-display area NDA disposed adjacent to a first shorter side (e.g., the left side in FIG. 1) of the display device 10, but the present disclosure is not limited thereto. The scan driver SDR may also be disposed in the non-display area NDA disposed adjacent to a second shorter side (e.g., the right side in FIG. 1) of the display device 10. The scan driver SDR may be connected to a signal connection line CWL, and at least one end of the signal connection line CWL may form (e.g., may terminate in) a wire pad WPD_CW (hereinafter referred to as a signal connection pad) in the non-display area NDA to be connected to an external device.

The data line DTL and the initialization voltage line VIL may be extended in (or may extend in) the second direction DR2 crossing the first direction DR1. The initialization voltage line VIL may further include portions branching off in the first direction DR1 as well as the portion extended in the second direction DR2.

The first voltage line VDL and the second voltage line VSL may be extended in (or may extend in) the second direction DR2. The first voltage line VDL and the second voltage line VSL may further include portions extended in (or extending in) the first direction DR1. The portions extended in the first direction DR1 and the portions extended in the second direction DR2 of the first voltage line VDL and the second voltage line VSL may be conductive layers disposed in (or on) different layers. The first voltage line VDL and the second voltage line VSL may have, but are not limited to, a mesh structure.

The data line DTL, the initialization voltage line VIL, the first voltage line VDL, and the second voltage line VSL may be electrically connected to one or more wire pads WPD. The wire pads WPD may be disposed in a pad area PDA included in the non-display area NDA. The pad area PDA may be disposed in the non-display area NDA adjacent to a first longer side (e.g., the upper side in FIG. 1) of the display device 10 and in the non-display area NDA adjacent a second longer side (e.g., the lower side in FIG. 1) of the display device 10.

According to an embodiment of the present disclosure, wire pads WPD_DT of the data lines DTL (hereinafter referred to as data pads) may be disposed in the pad area PDA located on the lower side, while a wire pad WPD_VINT of the initialization voltage line VIL (hereinafter referred to as an initial voltage pad), a wire pad WPD_VDD of the first voltage line VDL (hereinafter referred to as a first voltage pad), and a wire pad WPD_VSS of the second voltage line VSL (hereinafter referred to as a second voltage pad) may be disposed in the pad area PDA located on the upper side. As another example, the data pads WPD_DT, the initialization voltage pad WPD_VINT and the first supply voltage pad WPD_VDD and the second supply voltage pad WPD_VSS may all be disposed in the same area (e.g., in the non-display area NDA on the upper side of the display area DPA). External devices may be mounted on the wire pads WPD. External devices may be mounted on the wire pads WPD by an anisotropic conductive film, ultrasonic bonding, etc.

Each of the pixels PX of the display device 10 includes a pixel driving circuit. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be suitably varied. According to an embodiment of the present disclosure, each of the sub-pixels SPX of the display device 10 may have a 3T1C structure, that is, a pixel driving circuit including three transistors and one capacitor. In the following description, the pixel driving circuit will be described as having the 3T1C as an example. It is, however, to be understood that the present disclosure is not limited thereto. A variety of modified pixel structures may be employed, such as a 2T1C structure, a 7T1C structure, and a 6T1C structure.

Figure 3:
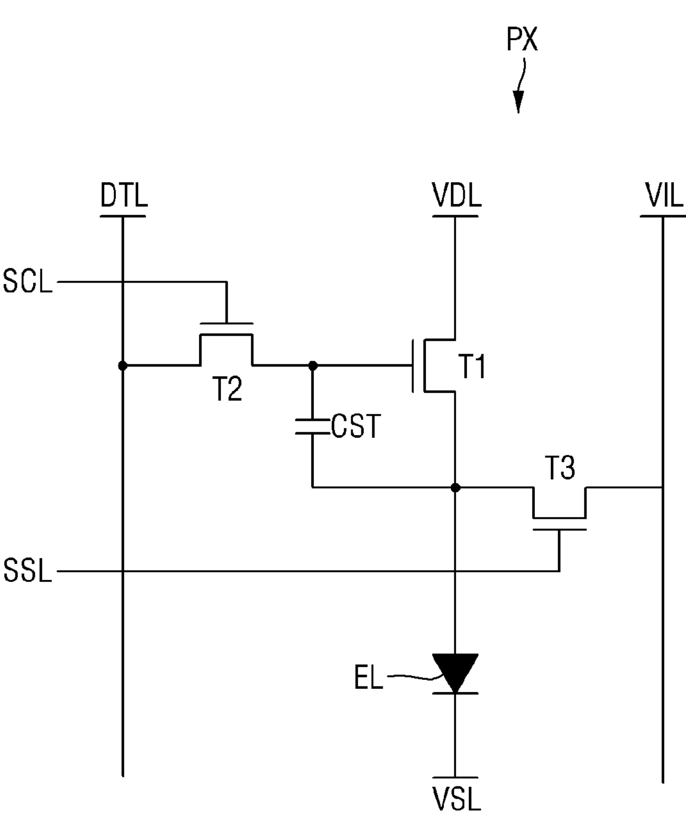
FIG. 3 is an equivalent circuit diagram of a pixel of a display device according to an embodiment of the present disclosure.

FIG. 3 is an equivalent circuit diagram of a pixel of a display device according to an embodiment of the present disclosure.

Referring to FIG. 3, each of the pixels PX of the display device 10 according to an embodiment may include a light-emitting element EL, a plurality of transistors T1, T2, and T3, and a capacitor Cst. The plurality of transistors T1, T2, and T3 may include a first transistor T1, a second transistor T2, and a third transistor T3.

The light-emitting diode EL emits light proportion to the current supplied through the first transistor T1. The light-emitting diode EL includes a first electrode, a second electrode, and at least one light-emitting element disposed therebetween. The light-emitting element may emit light in a particular wavelength range by (or according to) an electric signal transmitted from the first electrode and the second electrode.

One end of the light-emitting diode EL may be connected to a source electrode of the first transistor T1, and the other end thereof may be connected to the second voltage line VSL, from which a low-level voltage (hereinafter referred to as a second supply voltage) lower than a high-level voltage (hereinafter referred to as a first supply voltage) of the first voltage line VDL is applied.

The first transistor T1 adjusts a current flowing from the first supply voltage line VDL, from which the first supply voltage is supplied, to the light-emitting diode EL according to the voltage difference between a gate electrode and the source electrode. For example, the first transistor T1 may be a driving transistor for driving the light-emitting diode EL. The gate electrode of the first transistor T1 may be connected to a second source/drain electrode of the second transistor T2, the source electrode of the first transistor T1 may be connected to the first electrode of the light-emitting diode EL, and the drain electrode of the first transistor T1 may be connected to the first voltage line VDL from which the first supply voltage is applied.

The second transistor T2 is turned on by a scan signal of the scan line SCL to connect the data line DTL to the gate electrode of the first transistor T1. A gate electrode of the second transistor T2 may be connected to the scan line SCL, the second source/drain electrode of the second transistor T2 may be connected to the gate electrode of the first transistor T1, and a first source/drain electrode of the second transistor T2 may be connected to the data line DTL.

The third transistor T3 may be turned on by a sensing signal of the sensing line SSL to connect the initialization voltage line VIL to the source electrode of the first transistor T1. The gate electrode of the third transistor T3 may be connected to the sensing line SSL, the first source/drain electrode of the third transistor T3 may be connected to the initialization voltage line VIL, and the second source/drain electrode of the third transistor T3 may be connected to the source electrode of the first transistor T1.

According to an embodiment of the present disclosure, the first source/drain electrode of each of the second and third transistors T2 and T3 may be a source electrode while the second source/drain electrode thereof may be a drain electrode. It is, however, to be understood that the present disclosure is not limited thereto. The first source/drain electrode of each of the second and third transistors T2 and T3 may be a drain electrode while the second source/drain electrode thereof may be a source electrode.

The capacitor CST is formed between the gate electrode and the source electrode of the first transistor T1. The capacitor CST stores a voltage difference between the gate voltage and the source voltage of the first transistor T1.

Each of the first to third transistors T1, T2, and T3 may be formed as a thin-film transistor. Although each of the first to third transistors T1, T2, and T3 is implemented as an n-type MOSFET (metal oxide semiconductor field effect transistor) in the example shown in FIG. 3, the present disclosure is not limited thereto. For example, the first to third transistors T1, T2, and T3 may be implemented as p-type MOSFETs, or some of the first to third transistors T1, T2, and T3 may be implemented as n-type MOSFETs while the others may be implemented as p-type MOSFETs.

Figure 4:
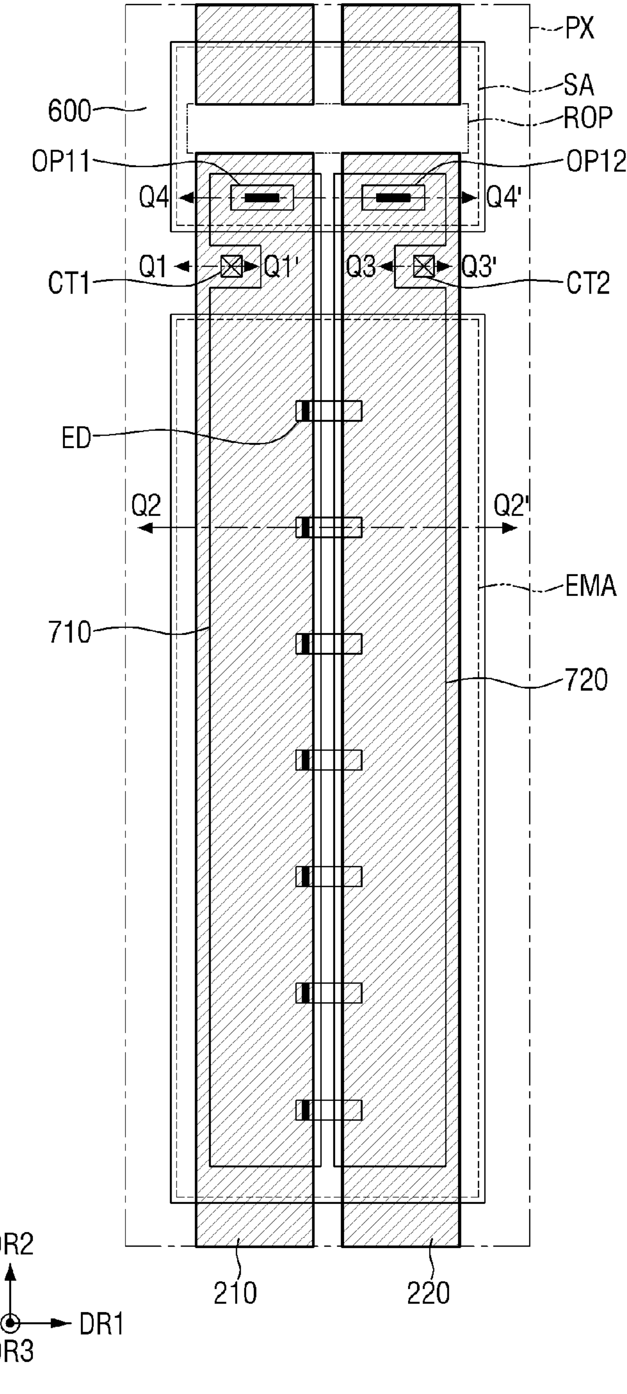
FIG. 4 is a schematic plan view showing a pixel in a display device according to an embodiment of the present disclosure.

FIG. 4 is a schematic plan view showing a pixel in a display device according to an embodiment of the present disclosure.

Referring to FIG. 4, each pixel PX of the display device 10 may include an emission area EMA and a non-emission area. Light emitted from the light-emitting diodes ED may exit at the emission area EMA. Light emitted from the light-emitting diodes ED does not reach and, thus, no light exits from the non-emission area.

The emission area EMA may include an area where the light-emitting diodes ED are disposed and an area adjacent to it. In addition, the emission area EMA may further include an area in which light emitted from the light-emitting diodes ED is reflected or refracted by other elements to exit.

Each pixel PX may further include a subsidiary area SA disposed in the non-emission area. No light-emitting diodes ED may be disposed in the subsidiary area SA. The subsidiary area SA may be disposed on the upper side of the emission area EMA (e.g., one side in the second direction DR2) within one pixel PX. The subsidiary area SA may be disposed between the emission areas EMA of neighboring pixels PX in the second direction DR2.

The subsidiary area SA may include a separation region ROP. In the separation region ROP of the subsidiary area SA, a first electrode 210 and a second electrode 220 included in a sub-pixel SPX may be separated from a first electrode 210 and a second electrode 220 included in another sub-pixel SPX adjacent to the sub-pixel SPX in the second direction DR2, respectively. Accordingly, parts of the first electrode 210 and the second electrode 220 disposed in each of the sub-pixels SPX may be disposed in the subsidiary area SA.

Figure 5:
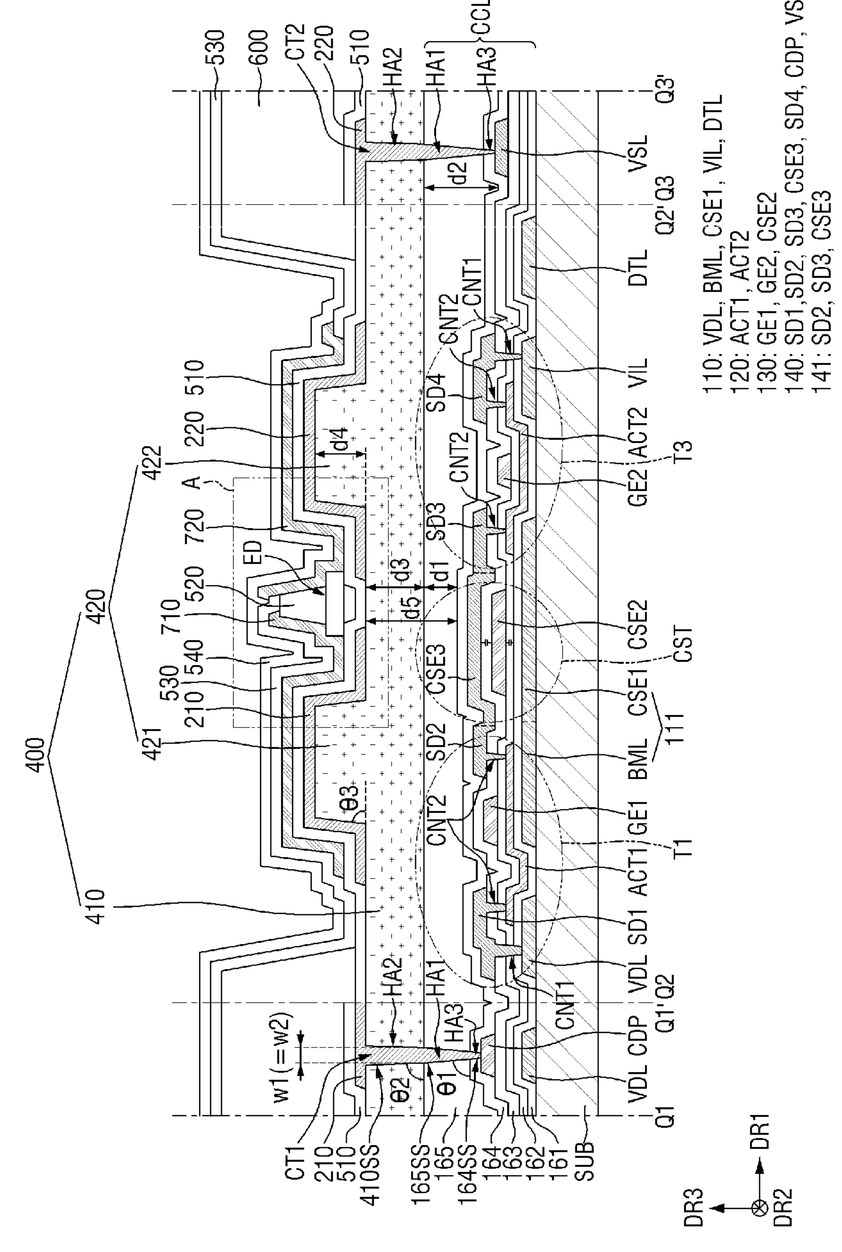
FIG. 5 is a cross-sectional view taken along the lines Q1-Q1', Q2-Q2', and Q3-Q3' of FIG. 4.
Figure 6:
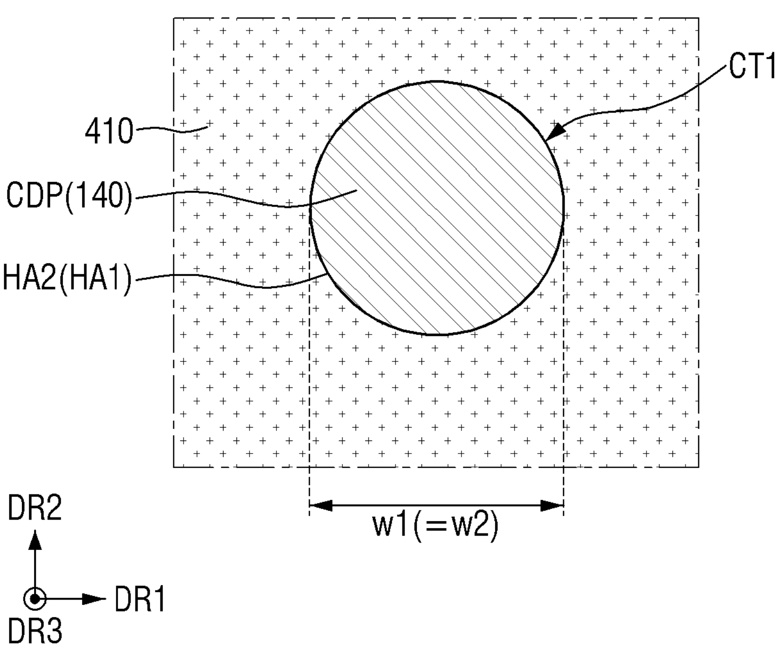
FIG. 6 is a plan view showing a layout of a peripheral area around a first opening and a second opening forming a first electrode contact opening shown in FIG. 5.
Figure 7:
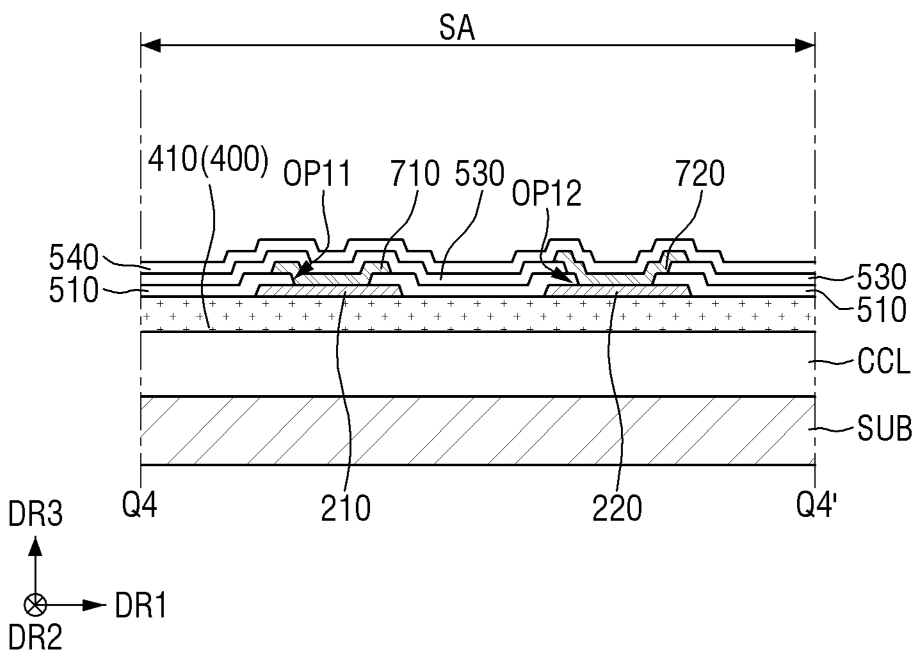
FIG. 7 is a cross-sectional view taken along the line Q4-Q4' of FIG. 4.

FIG. 5 is a cross-sectional view taken along the lines Q1-Q1', Q2-Q2', and Q3-Q3' of FIG. 4. FIG. 6 is a plan view showing a layout of a peripheral area around a first opening (e.g., a first hole) and a second opening (e.g., a second hole) forming a first electrode contact opening (e.g., a first electrode contact hole) CT1 shown in FIG. 5. FIG. 7 is a cross-sectional view taken along the line Q4-Q4' of FIG. 4.

FIG. 5 shows a cross section of a part of the emission area EMA taken along the line Q1-Q1' of FIG. 4 as well as a cross section of a part of the non-emission area taken along the lines Q2-Q2' and Q3-Q3' of FIG. 4. FIG. 5 shows a cross section of the first transistor T1 and the third transistor T3 from among the three transistors and a cross section of the capacitor CST as the cross section of the circuit element layer CCL disposed in the emission area EMA, and a cross section of the area where the first electrode 210 and the second electrode 220 are connected to the third conductive layer 140 thereunder as the cross section of the non-emission area.

Referring to FIGS. 3 and 5, as described above, one pixel includes the plurality of transistors T1, T2, and T3 and the capacitor CST.

Each of the transistors T1, T2, and T3 includes a conductive layer forming an electrode, a plurality of semiconductor patterns forming a channel, and an insulating film. The capacitor CST includes conductive layers forming electrodes and an insulating film disposed between the conductive layers. For example, the capacitor CST includes a first capacitor electrode CSE1, a second capacitor electrode CSE2, a third capacitor electrode CSE3, and insulating films disposed therebetween. The above-described conductive material, conductive layers, semiconductor patterns and insulating films are disposed on the substrate SUB.

The display device 10 according to an embodiment includes the substrate SUB, the circuit element layer CCL disposed on the substrate SUB, and a light-emitting element layer disposed on the circuit element layer CCL.

The circuit element layer CCL includes a semiconductor layer 120, a plurality of conductive layers 110, 130, and 140, a buffer layer 161, and a plurality of insulating films (e.g., insulating layers) 162, 163, 164, and 165 disposed on the substrate SUB. The plurality of conductive layers 110, 130, and 140 may include a first conductive layer 110, a second conductive layer 130, and a third conductive layer 140. The plurality of insulating layers may include a gate insulator 162, an interlayer insulating film 163, a passivation layer 164, and a first organic planarization layer 165.

The layers of the circuit element layer CCL may be disposed on the substrate SUB in the thickness direction of the substrate SUB (e.g., in the third direction DR3) in the order of the first conductive layer 110, the buffer layer 161, the semiconductor layer 120, the gate insulator 162, the second conductive layer 130, the interlayer insulating film 163, the third conductive layer 140, the passivation layer 164, and the first organic planarization layer 165. Each of the layers described above may include (or may be made up of) a single film or a stack of a plurality of films. Other layers may be additionally disposed between the layers.

The first conductive layer 110 is disposed on the substrate SUB. The first conductive layer 110 may include the first voltage line VDL, a light-blocking layer BML, the first capacitor electrode CSE1, the data line DTL, and the initialization voltage line VIL. The second voltage line VSL may also be formed as the first conductive layer 110. In such an embodiment, the second voltage line VSL of the third conductive layer 140 may be replaced with a conductive pattern connected to the second voltage line VSL formed as the first conductive layer 110.

The first voltage line VDL may be disposed so that it overlaps at least a part of a first active layer ACT1 of the first transistor T1 in the third direction DR3. The first voltage line VDL may overlap at least a part of a first electrode SD1 of the first transistor T1 in the thickness direction of the substrate SUB. A high-level voltage (e.g., a first supply voltage) supplied to the first transistor T1 may be applied to the first voltage line VDL.

The light-blocking layer BML protects the first active layer ACT1 of the first transistor T1. The light-blocking layer BML may be disposed under and cover at least a channel region of the first active layer ACT1 of the first transistor T1 and, further, may entirely cover the first active layer ACT1 of the first transistor T1. It is, however, to be understood that the present disclosure is not limited thereto. In some embodiments, the light-blocking layer BML may be omitted.

The first capacitor electrode CSE1 may overlap the second capacitor electrode CSE2 of the second conductive layer 130 and the third capacitor electrode CSE3 of the third conductive layer 140 in the thickness direction, which will be described later. Although not limited thereto, the light-blocking layer BML and the first capacitor electrode CSE1 may be integrally formed into a single first conductive layer pattern 111.

The initialization voltage line VIL may be disposed so that it overlaps at least a part of a second active layer ACT2 of the third transistor T3 in the third direction DR3. The initialization voltage line VIL may overlap at least a part of a second electrode SD4 of the third transistor T3 in the thickness direction of the substrate SUB.

The first conductive layer 110 may include a material that blocks light. The first conductive layer 110 may include an opaque metal material that blocks the transmission of light. The first conductive layer 110 may include titanium (Ti), copper (Cu), or the like. The first conductive layer 110 may include (or may be made up of) a single film or multiple films.

The buffer layer 161 may be disposed on the first conductive layer 110. The buffer layer 161 may be disposed to cover the entire surface of the substrate SUB on which the first conductive layer 110 is disposed. The buffer layer 161 may include (or may be formed of) a plurality of inorganic layers stacked on one another alternately. For example, the buffer layer 161 may include (or may be made up of) a plurality of layers in which inorganic layers, including at least one of a silicon oxide ($SiO_x$), a silicon nitride ($SiN_x$) and silicon oxynitride ($SiO_xN_y$), are stacked on one another alternately. The buffer layer 161 protects the plurality of transistors T1, T2, and T3 from moisture permeating through the substrate SUB, which is vulnerable to moisture permeation.

The semiconductor layer 120 may be disposed on the buffer layer 161. The semiconductor layer 120 may include the first active layer ACT1 and the second active layer ACT2. The first active layer ACT1 may be an active layer of the first transistor T1, and the second active layer ACT2 may be an active layer of the third transistor T3. The semiconductor layer 120 may further include an active layer (e.g., a third active layer) of the second transistor T2.

A part of the first active layer ACT1 may overlap the first voltage line VDL while another part thereof may overlap the light-blocking layer BML. In addition, a part of the second active layer ACT2 may overlap the first capacitor electrode CSE1 while another part thereof may overlap the initialization voltage line VIL.

The semiconductor layer 120 may include polycrystalline silicon, monocrystalline silicon, an oxide semiconductor, etc. According to an embodiment of the present disclosure, when the semiconductor layer includes polycrystalline silicon, the polycrystalline silicon may be formed by crystallizing amorphous silicon. When the semiconductor layer includes polycrystalline silicon, the first active layer ACT1 of the first transistor T1 and the second active layer ACT2 of the third transistor T3 may include doping regions doped with impurities and a channel region therebetween. In another embodiment, the semiconductor layer may include an oxide semiconductor. For example, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc.

The gate insulator 162 may be disposed on the semiconductor layer 120. The gate insulator 162 may act as a gate insulating film for each of the transistors T1, T2, and T3. The gate insulator 162 may include (or may be made up of) a plurality of layers in which inorganic layers including inorganic insulating material, for example, at least one of silicon oxide ($SiO_x$), silicon nitride ($SiN_x$) and silicon oxynitride ($SiO_xN_y$), are stacked on one another alternately.

The second conductive layer 130 may be disposed on the gate insulator 162. The second conductive layer 130 may include a first gate electrode GE1, a second gate electrode GE2, and a second capacitor electrode CSE2. The first gate electrode GE1 may be the gate electrode GE1 of the first transistor T1, and the second gate electrode GE2 may be the gate electrode GE2 of the third transistor T3. The second conductive layer 130 may further include the gate electrode of the second transistor T2. The second conductive layer 130 may include (or may be made of) a low resistance material. The second conductive layer 130 may include, but is not limited to, a material, such as copper (Cu), titanium (Ti), molybdenum (Mo), aluminum (Al), and silver (Ag).

The first gate electrode GE1 may overlap the channel region of the first active layer ACT1 of the first transistor T1 in the third direction DR3, which is the thickness direction of the substrate SUB. The second gate electrode GE2 may overlap the channel region of the second active layer ACT2 of the third transistor T3 in the third direction DR3, which is the thickness direction of the substrate SUB.

The second capacitor electrode CSE2 may overlap the first capacitor electrode CSE1 disposed thereunder in the third direction DR3, which is the thickness direction of the substrate SUB. For example, the second capacitor electrode CSE2 may overlap the first capacitor electrode CSE1 of the first conductive layer 110 and the third capacitor electrode CSE3 of the third conductive layer 140 in the third direction DR3.

Although the first gate electrode GE1 of the first transistor T1 and the second capacitor electrode CSE2 are spaced apart from each other in the drawings, the first gate electrode GE1 of the first transistor T1 and the second capacitor electrode CSE2 may be formed integrally into a single second conductive layer pattern.

The interlayer insulating film 163 may be disposed on the second conductive layer 130. The interlayer insulating film 163 may be disposed to cover the second conductive layer 130 and may act as an insulating film between the second conductive layer 130 and other layers disposed thereon. The interlayer insulating film 163 may include (or may be made up of) a plurality of layers in which inorganic layers including inorganic insulating material, for example, at least one of silicon oxide ($SiO_x$), silicon nitride ($SiN_x$) and silicon oxynitride ($SiO_xN_y$), are stacked on one another alternately.

The third conductive layer 140 may be disposed on the interlayer insulating film 163. The third conductive layer 140 may include a first electrode SD1 (e.g., a drain electrode) of the first transistor T1, a second electrode SD2 (e.g., a source electrode) of the first transistor T1, a first electrode SD3 (e.g., a first source/drain electrode) of the third transistor T3, a second electrode SD4 (e.g., a second source/drain electrode) of the third transistor T3, the third capacitor electrode CSE3, the second voltage line VSL, and a conductive pattern CDP. The third conductive layer 140 may further include the first electrode of the second transistor T2 and the second electrode of the second transistor T2.

The first electrode SD1 and the second electrode SD2 of the first transistor T1 may be electrically connected to both end regions of the first active layer ACT1 of the first transistor T1 through second contact openings (e.g., second contact holes) CNT2 penetrating the first interlayer insulating film 163 and the gate insulator 162, respectively. In addition, the first electrode SD1 of the first transistor T1 may be electrically connected to the first voltage line VDL of the first conductive layer 110 through a first contact opening (e.g., a first contact hole) CNT1 penetrating through the first interlayer insulating film 163, the gate insulator 162, and the buffer layer 161. The second electrode SD2 of the first transistor T1 may be electrically connected to the light-blocking layer BML of the first conductive layer 110 through the first contact opening CNT1 penetrating through the first interlayer insulating film 163, the gate insulator 162, and the buffer layer 161. Because the second electrode SD2 of the first transistor T1 is electrically connected to the light-blocking layer BML disposed thereunder, the third capacitor electrode CSE3 formed integrally with the second electrode SD2 of the first transistor T1 of the third conductive layer 140 may be electrically connected to the first capacitor electrode CSE1 formed integrally with the light-blocking layer BML of the first conductive layer 110.

The first electrode SD3 and the second electrode SD4 of the third transistor T3 may be electrically connected to both end regions of the second active layer ACT2 of the third transistor T3 through second contact openings CNT2 penetrating the first interlayer insulating film 163 and the gate insulator 162, respectively. In addition, the second electrode SD4 of the third transistor T3 may be electrically connected to the initialization voltage line VIL of the first conductive layer 110 through the first contact opening CNT1 penetrating through the first interlayer insulating film 163, the gate insulator 162, and the buffer layer 161.

The third capacitor electrode CSE3 may overlap the first capacitor electrode CSE1 and the second capacitor electrode CSE2 in the third direction DR3, which is the thickness direction. For example, the third capacitor electrode CSE3 may overlap the first capacitor electrode CSE1 of the first conductive layer 110 and the second capacitor electrode CSE2 of the second conductive layer 130 in the third direction DR3.

The second capacitor electrode CSE2 may be disposed between the first capacitor electrode CSE1 and the third capacitor electrode CSE3 so that it overlaps with the first capacitor electrode CSE1 and the third capacitor electrode CSE3 in the third direction DR3. The second capacitor electrode CSE2 may be disposed so that it overlaps the first capacitor electrode CSE1 with the gate insulator 162 and the buffer layer 161 therebetween, and overlaps the third capacitor electrode CSE3 with the interlayer insulating film 163 therebetween, to form the capacitor CST. The gate insulator 162 interposed between the second capacitor electrode CSE2 and the first capacitor electrode CSE1, and the interlayer insulating film 163 interposed between the buffer layer 161 and the second capacitor electrode CSE2 and between the buffer layer 161 and the third capacitor electrode CSE3, may be the dielectric of the capacitor CST. In the region where the capacitor CST is formed, the first to third conductive layers 110, 130, and 140 may be disposed to overlap one another in the third direction DR3.

Although not limited thereto, the second electrode SD2 of the first transistor T1, the third capacitor electrode CSE3, and the first electrode SD3 of the third transistor T3 may be formed integrally into a third conductive layer pattern 141.

The conductive pattern CDP may be electrically connected to the first transistor T1. The conductive pattern CDP may be electrically connected to the second electrode SD2 of the first transistor T1 in another partial region. In addition, the first conductive pattern CDP may be electrically connected to the first electrode 210 through the first electrode contact opening CT1 penetrating through the passivation layer 164, the first organic planarization layer 165, and the second organic planarization layer 410. The first transistor T1 may transmit the first supply voltage applied from the first voltage line VDL to the first electrode 210 through the conductive pattern CDP.

The conductive pattern CDP may be exposed in the third direction DR3 by a third opening (e.g., a third hole) HA3 penetrating through the passivation layer 164 and a first opening (e.g., a first hole) HA1 penetrating the first organic planarization layer 165, to be described later. In addition, the conductive pattern CDP may be exposed in the third direction DR3 by a second opening (e.g., a second hole) HA2 penetrating the second organic planarization layer 410 of the organic layer 400, to be described later. The second opening HA2 may be disposed to overlap at least a part of the first opening HA1 and the third opening HA3 in the third direction DR3. The above-described first electrode contact opening CT1 may be formed as an opening (e.g., a through-hole) formed of the first opening HA1 and the third opening HA3 or as the second opening HA2.

The low-level voltage (e.g., the second supply voltage), which is lower than the high-level voltage supplied to the first voltage line VDL, may be applied to the second voltage line VSL. The second voltage line VSL may be electrically connected to the second electrode 220 through a second electrode contact opening (e.g., a second contact hole) CT2 penetrating through the passivation layer 164, the first organic planarization layer 165, and the second organic planarization layer 410, to be described later. The second supply voltage applied to the second voltage line VSL may be supplied to the second electrode 220. An alignment signal for aligning the light-emitting diodes ED during the process of fabricating the display device 10 may be applied to the second voltage line VSL.

The second voltage line VSL may be exposed in the third direction DR3 by the through-hole formed of the third opening HA3 penetrating through the passivation layer 164 and the first opening HA1 penetrating the first organic planarization layer 165, to be described later. In addition, the conductive pattern CDP may be exposed in the third direction DR3 by the second opening HA2 penetrating the second organic planarization layer 410 of the organic layer 400, to be described later. The second opening HA2 may be disposed to overlap at least a part of the through-hole formed of the first opening HA1 and the third opening HA3 in the third direction DR3. The above-described second electrode contact opening CT2 may be formed of the through-hole formed of the first opening HA1 and the third opening HA3 or the second opening HA2.

The passivation layer 164 may be disposed on the third conductive layer 140. The passivation layer 164 covers and protects the third conductive layer 140. The passivation layer 164 may include (or may be made up of) an inorganic layer including an inorganic insulating material, such as silicon oxide ($SiO_x$), silicon nitride ($SiN_x$) and silicon oxynitride (SiON), or may be formed of a stack of such materials.

The passivation layer 164 may have surface level differences according to the shape or presence of patterns disposed thereunder. For example, the passivation layer 164, when made of an inorganic material, may have a surface shape conforming to the level differences thereunder. For example, the thickness of a part of the surface of the passivation layer 164 where the first to third conductive layers 110, 130, and 140 overlap one another in the third direction DR3, may be different from the thickness of a part of the surface of the passivation layer 164 where the first to third conductive layers 110, 130, and 140 are not disposed. Such thicknesses of the different parts of the passivation layer 164 may be compared with each other based on the thickness measured from the same flat reference surface without any structure disposed thereunder (e.g., from the upper surface of buffer layer 161).

The first organic planarization layer 165 may be disposed on the passivation layer 164. The first organic planarization layer 165 may be disposed on the passivation layer 164 to provide a flat surface over the level differences created by a plurality of layers disposed thereunder. In addition, the first organic planarization layer 165 may be disposed between the third conductive layer 140 and the electrode layers 210 and 220 together with the second organic planarization layer 410 of the organic layer 400, to be described later, and may prevent or substantially prevent coupling between the plurality of layers included in the third conductive layer 140 and the electrode layers 210 and 220.

The first organic planarization layer 165 may include an organic insulating material, such as polyacrylate resin, epoxy resin, phenolic resin, polyamide resin, polyimide resin, unsaturated polyesters resin, polyphenylene ether resin, polyphenylene sulfide resin, and benzocyclobutene (BCB). The first organic planarization layer 165 may further include, but is not limited to, a photosensitive material. According to an embodiment of the present disclosure, the first organic planarization layer 165 may include polyimide (PI).

The first organic planarization layer 165 may have a generally flat surface regardless of the shape or presence of patterns disposed thereunder. The first organic planarization layer 165 may have different thicknesses for different regions according to the shape or presence of patterns of the plurality of conductive layers 110, 130, and 140 disposed thereunder. For example, the first thickness d1 of the part of the first organic planarization layer 165 where the first to third conductive layers 110, 130, and 140 and the plurality of insulating films 161, 162, 163, and 164 all overlap one another in the third direction DR3 may be different from the second thickness d2 of the part of the first organic planarization layer 165 where the plurality of conductive layers is not disposed. Because the first organic planarization layer 165 has a flat surface, the first thickness d1 of the first organic planarization layer 165 may be smaller than the second thickness d2 of the first organic planarization layer 165. Herein, the thickness of the first organic planarization layer 165 may be measured as the distance from the upper surface (or surface) of the passivation layer 164 to the upper surface (or surface) of the first organic planarization layer 165.

The first organic planarization layer 165 may include a plurality of first openings HA1 penetrating the first organic planarization layer 165, and the passivation layer 164 may include a plurality of third openings HA3 penetrating the passivation layer 164. The first openings HA1 and the third openings HA3 may be formed at locations where the first electrode contact opening CT1 and the second electrode contact opening CT2 are to be formed, which are described later, so that the conductive pattern CDP and the second voltage line VSL of the third conductive layer 140 may be exposed. The sidewalls 164SS of the passivation layer 164 forming the third opening HA3 and the sidewalls 165SS of the first organic planarization layer 165 forming the first opening HA1 may be aligned in line with each other. As used herein, the expression that sidewalls of a first member (or opening) are aligned in line with sidewalls of a second member (or opening) may indicate that the sidewalls of the first member and the sidewalls of the second member are located on the same plane. In addition, the expression that sidewalls of a first member are aligned in line with sidewalls of a second member may indicate that the sidewalls of the first member and the sidewalls of the second member are aligned without any protrusion, and an inclination angle of the sidewalls of the first member is equal to an inclination angle of the sidewalls of the second member. Accordingly, the term a structure in which the sidewalls of a first member and the sidewalls of a second member are not aligned in line with each other may refer to a structure in which the sidewalls of the first member and the sidewalls of the second member are located on different planes, a structure in which the sidewalls of the first member protrudes from or is located more to the inside of the sidewalls of the second member, or a structure in which the sidewalls of the first member neither protrudes from nor aligned more to the inside of the sidewalls of the second member, but the inclination angle of the sidewalls of the first member is different from the inclination angle of the sidewalls of the second member.

The light-emitting element layer may be disposed on the circuit element layer CCL. The light-emitting element layer according to the embodiment includes the organic layer 400 including the second organic planarization layer 410 and a first bank 420, a second bank 600, an electrode layer including first and second electrodes 210 and 220, a plurality of light-emitting diodes ED, a first contact electrode 710, a second contact electrode 720, and a plurality of insulating layers 510, 520, 530, and 540.

The organic layer 400 may be disposed on the first organic planarization layer 165. The organic layer 400 may cover the upper surface of the first organic planarization layer 165 and may be disposed directly on the first organic planarization layer 165.

The organic layer 400 may include an organic insulating material, such as polyacrylate resin, epoxy resin, phenolic resin, polyamide resin, polyimide resin, unsaturated polyesters resin, polyphenylene ether resin, polyphenylene sulfide resin, and benzocyclobutene (BCB). The organic layer 400 may further include, but is not limited to, a photosensitive material. In some embodiments, the organic layer 400 may include the same material as the first organic planarization layer 165. For example, the organic layer 400 may include polyimide (PI). It is, however, to be understood that the present disclosure is not limited thereto. In some other embodiments, the organic layer 400 may include a material different from the first organic planarization layer 165.

The organic layer 400 may include level differences. The organic layer 400 may include a structure having different heights across different regions. The organic layer 400 may include a first region 410 having a first height and a second region 420 having a second height higher than the first height. The height of the organic layer 400 may be measured from a reference surface, such as one surface of the substrate SUB. The organic layer 400 may have a generally flat surface regardless of the shape or presence of patterns disposed thereunder within each of the regions. The organic layer 400 may have level differences at the boundary between the regions. Hereinafter, the first region 410 of the organic layer 400 will be referred to as the second organic planarization layer 410, and the second region 420 of the organic layer 400 will be referred to as the first bank 420.

The second organic planarization layer 410 may be disposed on the upper surface of the first organic planarization layer 165. The second organic planarization layer 410 may cover the upper surface of the first organic planarization layer 165, and the second opening HA2 may penetrate through the second organic planarization layer 410 at a location in line with the through-hole formed of the first opening HA1 and the third opening HA3. The second opening HA2 in the second organic planarization layer 410 may form each of the first electrode contact opening CT1 and the second electrode contact opening CT2 along with the through-hole formed of the first opening HA1 and the third opening HA3. It is, however, to be understood that the present disclosure is not limited thereto. Each of the first electrode contact opening CT1 and the second electrode contact opening CT2 may be formed only of the second opening HA2.

The second organic planarization layer 410 may prevent or substantially prevent the occurrence of coupling between the third conductive layer 140 and the first electrode 210 and between the third conductive layer 140 and the second electrode 220 together with the first organic planarization layer 165. Therefore, the second organic planarization layer 410 may be formed to have a sufficient thickness to prevent or substantially prevent the occurrence of coupling between the first and second electrodes 210 and 220 and a plurality of conductive layers disposed thereunder.

The minimum distance d5 between the first electrode 210 and the second electrode 220 and the upper surface of the passivation layer 165 disposed thereunder may be equal to the sum of the minimum thickness d1 of the first organic planarization layer 165 and the thickness d3 of the second organic planarization layer 410. Because the first organic planarization layer 165 and the second organic planarization layer 410 are disposed between the first and second electrodes 210 and 220 and the third conductive layer 140, the thickness between the first and second electrodes 210 and 220 and the passivation layer 164 disposed therebelow is increased compared to the structure in which only the first organic planarization layer 165 is disposed. Accordingly, it is possible to prevent or further mitigate a short circuit between a plurality of conductive layers, to prevent or further mitigate coupling between the first and second electrodes 210 and 220 and the third conductive layer 140.

The first bank 420 may be disposed in the emission area EMA and may have a shape protruding from the second organic planarization layer 410 in the thickness direction of the substrate SUB (e.g., in the third direction DR3). At least a part of the first bank 420 may protrude from the upper surface of the second organic planarization layer 410 upwardly (e.g., toward one side of the third direction DR3). The protruding part of the first bank 420 may have inclined side surfaces.

The first bank 420 may include a first sub-bank 421 and a second sub-bank 422. The first sub-bank 421 and the second sub-bank 422 may be spaced apart from each other in the first direction DR1. A plurality of light-emitting diodes ED may be disposed in the space between the first sub-bank 421 and the second sub-bank 422.

Because the first bank 420 includes the inclined side surfaces, light that is emitted from the light-emitting diodes ED and travels toward the side surfaces of the first bank 420 can be guided toward the upper side (e.g., display side). For example, the first bank 420 may provide the space where the light-emitting diodes ED are disposed and may also provide reflective partition walls that change the traveling direction of light emitted from the light-emitting diodes ED toward the display side. Although the side surfaces of the first bank 420 have an inclined linear shape in the drawings, the present disclosure is not limited thereto. For example, the sidewalls (or outer surfaces) of the first bank 420 may have a curved semi-circle or semi-ellipse shape.

The organic layer 400 having different heights across different regions may include an organic material containing a photosensitive material as described above. In such an embodiment, the second organic planarization layer 410 and the first bank 420 of the organic layer 400 may be integrated and formed via a single process. The organic layer 400 may be formed using a halftone mask or a slit mask. When the patterned organic layer 400 is integrally formed via a single mask process, the sidewalls of the second organic planarization layer 410 forming the second opening HA2 penetrating the second organic planarization layer 410 and the sidewalls 410SS of the first bank 420 may have substantially similar inclination angles. According to an embodiment of the present disclosure, a second inclination angle θ2 of the sidewalls 410SS of the second organic planarization layer 410 forming the second opening HA2 may be equal to a third inclination angle θ3 of the sidewalls of the first bank 420. It is, however, to be understood that the present disclosure is not limited thereto.

Hereinafter, a structure of the first electrode contact opening CT1 and the second electrode contact opening CT2 and a structure of the first bank 420 will be described in detail with reference to FIGS. 5 and 6.

As described above, each of the first electrode contact opening CT1 and the second electrode contact opening CT2 may be formed as the through-hole formed of the third opening HA3 penetrating the passivation layer 164 and the first opening HA1 penetrating the first organic planarization layer 165, or as the second opening HA2 penetrating the second organic planarization layer 410. According to an embodiment of the present disclosure, each of the first electrode contact opening CT1 and the second electrode contact opening CT2 may include the first opening HA1, the second opening HA2, and the third opening HA3.

The first opening HA1 may be formed by (or defined by) the sidewalls 165SS of the first organic planarization layer 165, and the third opening HA3 may be formed by (or defined by) the sidewalls 164SS of the passivation layer 164. The sidewalls 164SS of the passivation layer 164 forming the third opening HA3 and the sidewalls 165SS of the first organic planarization layer 165 forming the first opening HA1 may be aligned in line with each other as described above.

The second opening HA2 may at least partially overlap the first opening HA1 and the third opening HA3 in the third direction DR3. The second opening HA2 may be formed by (or defined by) the sidewalls 410SS of the second organic planarization layer 410. According to an embodiment of the present disclosure, the sidewalls 410SS of the second organic planarization layer 410 forming the second opening HA2 may be aligned in line with the sidewalls 165SS of the first organic planarization layer 165.

The first opening HA1 and the second opening HA2 may be formed via different processes. In addition, the first opening HA1 and the third opening HA3 may be formed via the same process. Accordingly, the first inclination angle θ1 of the sidewalls 165SS of the first organic planarization layer 165 forming the first opening HA1 may be equal to the first inclination angle θ1 of the sidewalls 164SS of the passivation layer 164 forming the third opening HA3. In addition, the first inclination angle θ1 of the sidewalls 165SS of the first organic planarization layer 165 forming the first opening HA1 may be different from the second inclination angle θ2 of the sidewalls 410SS of the second organic planarization layer 410 forming the second opening HA2. The first inclination angle θ1 may be smaller than the second inclination angle θ2. It is, however, to be understood that the present disclosure is not limited thereto. The first inclination angle θ1 may be equal to the second inclination angle θ2. For example, the first to third inclination angles θ1, θ2, and θ3 may each be in a range of less than about 60°, and in some embodiments, may be in a range of about 45° or less.

The first opening HA1 and the second opening HA2 may overlap each other in the third direction DR3 when viewed from the top. The diameter (or width) W1 of the first opening HA1 may be equal to the diameter W2 of the second opening HA2 measured on the upper surface of the first organic planarization layer 165 (or the lower surface of the second organic planarization layer 410). Because the first opening HA1 and the second opening HA2 are completely aligned with each other in the third direction DR3, each of the first and second electrode contact openings CT1 and CT2 may be formed of the first opening HA1 and the second opening HA2.

Hereinafter, a plurality of layers disposed on the organic layer 400 of the light-emitting element layer will be described in detail.

Referring to FIGS. 4, 5, and 7, the electrode layers 210 and 220 may be disposed on the organic layer 400. The electrode layers 210 and 220 may include a first electrode 210 and a second electrode 220. The first electrode 210 may be disposed on the first sub-bank 421, and the second electrode 220 may be disposed on the second sub-bank 422.

Each of the first electrode 210 and the second electrode 220 may have a shape extended in the second direction DR2 when viewed from the top. The first electrode 210 and the second electrode 220 may be spaced apart from each other in the first direction DR1. The first and second electrodes 210 and 220 may have a shape substantially similar to that of the first and second sub-banks 421 and 422, respectively, but may have a large (or larger) area.

The first electrode 210 may be extended in the second direction DR2 so that it overlaps with a part of the second bank 600 extended in the first direction DR1 when viewed from the top. The first electrode 210 may contact the conductive pattern CDP of the third conductive layer 140 through the first electrode contact opening CT1 penetrating the organic layer 400, the first organic planarization layer 165, and the passivation layer 164. The first electrode 210 may be electrically connected to the first transistor T1 through the conductive pattern CDP. The first electrode 210 may be disposed on the sidewalls 165SS and 164SS of the first organic planarization layer 165 and the passivation layer 164 and on the sidewalls 410SS of the second organic planarization layer 410.

The second electrode 220 may be extended in the second direction DR2 so that it overlaps with a part of the second bank 600 extended in the first direction DR1 when viewed from the top. The second electrode 220 may contact the second voltage line VSL through the second electrode contact opening CT2 penetrating the organic layer 400, the first organic planarization layer 165, and the passivation layer 164. The second electrode 220 may be disposed on the sidewalls 165SS and 164SS of the first organic planarization layer 165 and the passivation layer 164 and on the sidewalls 410SS of the second organic planarization layer 410.

Although the first electrode contact opening CT1 and the second electrode contact opening CT2 are formed at locations such that they overlap the second bank 600 in the drawings, the present disclosure is not limited thereto. For example, the first contact opening CT1 and the second contact opening CT2 may not overlap the second bank 600 but may be disposed in the emission area EMA surrounded by the second bank 600 (e.g., the second bank 600 may extend around a periphery of the emission area EMA).

The first electrode 210 and the second electrode 220 may be separated from a first electrode 210 and a second electrode 220 of another pixel PX adjacent to the pixel PX in the second direction DR2, respectively, at the separation region ROP of the subsidiary area SA of the pixel PX. The first electrode 210 and the second electrode 220 having such a shape may be formed via a process of disconnecting the first and second electrodes 210 and 220 at the separation region ROP of the subsidiary area SA after the process of disposing the light-emitting diodes ED during the process of fabricating the display device 10. It is, however, to be understood that the present disclosure is not limited thereto. In some embodiments, the first and second electrodes 210 and 220 may be extended to another pixel PX adjacent to the pixel PX in the second direction DR2 to be integrated with the first and second electrodes of the adjacent pixel PX. In other embodiments, only one of the first electrode 210 and the second electrode 220 may be separated.

The shape and arrangement of the first electrode 210 and the second electrode 220 disposed for each pixel PX is not particularly limited herein as long as the first electrode 210 and the second electrode 220 are at least partially spaced apart from each other so that the light-emitting diodes ED can be disposed therebetween.

The first electrode 210 may be disposed on the first sub-bank 421 to cover an outer surface of the first sub-bank 421. The first electrode 210 may be extended outward from the side surfaces of the first sub-bank 421 and may be partially disposed on the upper surface of the second organic planarization layer 410 as well.

The second electrode 220 may be disposed on the second sub-bank 422 to cover the outer surface of the second sub-bank 422. The second electrode 220 may be extended outward from the side surfaces of the second sub-bank 422 and may be partially disposed on the upper surface of the second organic planarization layer 410 as well.

The first electrode 210 and the second electrode 220 are spaced apart from each other in the first direction DR1 on the second organic planarization layer 410 between the first sub-bank 421 and the second sub-bank 422.

The first and second electrodes 210 and 220 may be electrically connected to the light-emitting diodes ED, respectively, and the first and second electrodes 210 and 220 may receive a voltage (e.g., a predetermined voltage) so that the light-emitting diodes ED emit light. For example, the first and second electrodes 210 and 220 may be electrically connected to the light-emitting diodes ED disposed between the first electrode 210 and the second electrode 220 through first and second contact electrodes 710 and 720, to be described later, and may transmit electric signals to the light-emitting diodes ED through the first and second contact electrodes 710 and 720.

The first and second electrodes 210 and 220 may be utilized to form an electric field in the sub-pixel SPX to align the light-emitting diodes ED. The light-emitting diodes ED may be disposed between the first electrode 210 and the second electrode 220 by an electric field formed over the first electrode 210 and the second electrode 220.

A first insulating layer 510 may be disposed on the first and second electrode 210 and 220. The first insulating layer 510 may be disposed on the first electrode 210 and the second electrode 220 and may have openings OP11 and OP12 exposing at least parts of the first electrode 210 and the second electrode 220, respectively. The first opening OP11 may expose a part of the upper surface of the first electrode 210, and the second opening OP12 may expose a part of the upper surface of the second electrode 220. The first opening OP11 and the second opening OP12 may be located in the subsidiary area SA. The first and second electrodes 210 and 220 may be electrically connected to the first and second contact electrodes 710 and 720, to be described later, through the first opening OP11 and the second opening OP12 in the sub-area SA, respectively.

The first insulating layer 510 may protect the first electrode 210 and the second electrode 220 and insulate them from each other. In addition, the first insulating layer 510 may prevent (or substantially prevent) the light-emitting diodes ED disposed on it from contacting other elements and being damaged.

The second bank 600 may be disposed on the first insulating layer 510. The second bank 600 may be disposed across the boundary of the pixels SPX to distinguish between neighboring pixels PX and may distinguish the emission area EMA from the subsidiary area SA. In addition, the second bank 600 has a height greater than that of the first bank 420 to distinguish between the areas. Accordingly, during an inkjet printing process for aligning the light-emitting diodes ED of the process of fabricating the display device 10, the ink in which the plurality of light-emitting diodes ED is dispersed may not be mixed into the adjacent pixel PX, and thus, the ink can be ejected into the emission area EMA.

The light-emitting diodes ED may be disposed on the first insulating layer 510. The light-emitting diodes ED may be spaced apart from one another along the second direction DR2 in which the first and second electrodes 210 and 220 are extended and may be aligned substantially parallel to one another.

The light-emitting diode ED may include semiconductor layers doped to have different conductivity types. The light-emitting diode ED may include a plurality of semiconductor layers and may be aligned so that its first end is directed in a particular orientation depending on the direction of the electric field generated over the first electrode 210 and the second electrode 220. In addition, the light-emitting diode ED may include an active layer 33 (see, e.g., FIG. 8) to emit light of a particular wavelength band. The light-emitting diodes ED disposed in each of the pixels PX may emit light of different wavelength bands depending on the material of the active layer 33. It is, however, to be understood that the present disclosure is not limited thereto. The light-emitting diodes ED disposed in each of the pixels PX may emit light of the same color.

The light-emitting diodes ED may be disposed between the first sub-bank 421 and the second sub-bank 422. The light-emitting diodes ED may be disposed on the first insulating layer 510 so that both ends of the light-emitting diodes ED are positioned on the first electrode 210 and the second electrode 220, respectively, between the first sub-bank 421 and the second sub-bank 422. The light-emitting diodes ED may be disposed between the first electrode 210 and the second electrode and 220 so that first ends are disposed on the first electrode 210 and second ends are disposed on the second electrode 220.

The second insulating layer 520 may be partially disposed on the light-emitting diodes ED. The second insulating layer 520 may be disposed on the light-emitting diodes ED disposed between the first electrode 210 and the second electrode 220 to expose the both ends (e.g., the opposite ends) of the light-emitting diodes ED. The second insulating layer 520 may be disposed to partially surround the outer surface of the light-emitting diodes ED. The second insulating layer 520 may protect the light-emitting diode ED and fix the light-emitting diode ED during the process of fabricating the display device 10.

The material forming the second insulating layer 520 may be disposed between the first electrode 210 and the second electrode 220, and the recessed empty space between the first insulating layer 510 and the light-emitting diode ED may be filled with the material.

The plurality of contact electrodes 710 and 720 may be disposed on the second insulating layer 520. The contact electrodes 710 and 720 may include a first contact electrode 710 and a second contact electrode 720. The first contact electrode 710 and the second contact electrode 720 may be spaced apart from each other.

The first contact electrode 710 may be disposed on the first electrode 210. The first contact electrode 710 may have a shape extended in the second direction DR2. The first contact electrode 710 may contact the first electrode 210 and the first ends of the light-emitting diodes ED. The first contact electrode 710 may contact the first electrode 210 exposed by (or through) the first opening OP11 formed in the first insulating layer 510 in the subsidiary area SA and may contact the first ends of the light-emitting diodes ED exposed by the second insulating layer 520 in the emission area EMA. The first contact electrode 710 may electrically connect the first ends of the light-emitting diodes ED with the first electrode 210.

The third insulating layer 530 may be disposed on the first contact electrode 710. The third insulating layer 530 may be further disposed on the first insulating layer 510 and the second bank 600. The third insulating layer 530 may be disposed to cover the first contact electrode 710, the first insulating layer 510, and the second bank 600 and may not be disposed on the second ends of the light-emitting diodes ED so that the light-emitting diodes ED contact the second contact electrode 720 in the emission area EMA. In addition, the third insulating layer 530 may be disposed to cover the first contact electrode 710, the first insulating layer 510, and the second bank 600 and may form the second opening OP12 together with the first insulating layer 510 so that the second electrode 220 contacts the second contact electrode 720 in the subsidiary area SA. The third insulating layer 530 may electrically insulate the first contact electrode 710 from the second contact electrode 720.

The second contact electrode 720 may be disposed on the second electrode 220. The second contact electrode 720 may have a shape extended in the second direction DR2. The second contact electrode 720 may contact the second electrode 220 and the second ends of the light-emitting diodes ED. The second contact electrode 720 may contact the second electrode 220 exposed by the second opening OP12 formed in the first insulating layer 510 and the third insulating layer 530 in the subsidiary area SA and may contact the second ends of the light-emitting diodes ED exposed by the second insulating layer 520 in the emission area EMA. The second contact electrode 720 may electrically connect the second ends of the light-emitting diodes ED with the second electrode 220.

The first ends of the light-emitting diodes ED exposed by the second insulating layer 520 may be electrically connected to the first electrode 210 through the first contact electrode 710, and the second ends thereof may be electrically connected to the second electrode 220 through the second contact electrode 720.

The first and second contact electrodes 710 and 720 may include a conductive material. For example, the first and second contact electrodes 710 and 720 may include ITO, IZO, ITZO, aluminum (Al), etc. For example, the first and second contact electrodes 710 and 720 may include, but are not limited to, a transparent conductive material.

The fourth insulating layer 540 may be disposed entirely on the substrate SUB. The fourth insulating layer 540 may be disposed entirely on the substrate SUB to protect the elements disposed thereon against the external environment.

Each of the above-described first insulating layer 510, second insulating layer 520, third insulating layer 530, and fourth insulating layer 540 may include an inorganic insulating material or an organic insulating material.

The display device according to this embodiment may include the organic layer including the first organic planarization layer, the second organic planarization layer, and the first bank to compensate for surface level differences that may occur in regions where a plurality of conductive layers overlap each other. Further, the second organic planarization layer having a first height and the first bank having a second height higher than the first height of the organic layer may be formed via a single mask process. Accordingly, because the first bank and the second organic planarization layer are formed via a single mask process, and the second organic planarization layer is further disposed as an organic film interposed between the first and second electrodes and the third conductive layer, the thickness of the organic film between the first and second electrodes and the third conductive layer can be supplemented and may be reduced as the thickness of the first organic planarization layer is reduced during the process of forming the contact openings penetrating the passivation layer. In this manner, it is possible to prevent or substantially prevent a short-circuit or coupling between the first and second electrodes and the third conductive layer. Accordingly, the reliability of the display device can be improved.

Figure 8:
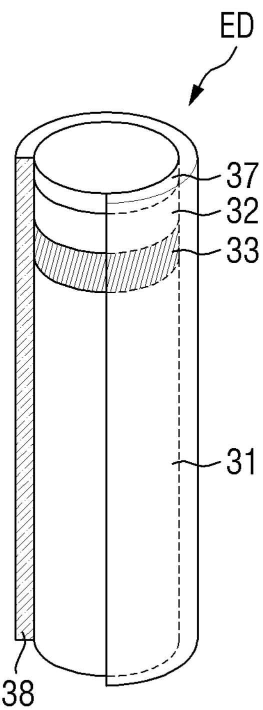
FIG. 8 is a view of a light-emitting element according to an embodiment of the present disclosure.

FIG. 8 is a view showing a light-emitting element according to an embodiment of the present disclosure.

Referring to FIG. 8, the light-emitting diode ED is a particulate element and may have a rod-like or cylindrical shape having an aspect ratio (e.g., a predetermined aspect ratio). The length of the light-emitting diode ED may be larger than the diameter of the light-emitting diode ED such that the aspect ratio may range from, but is not limited to, about 6:5 to about 100:1.

The light-emitting diode ED may have a size of a nanometer scale (from 1 nm to 1 μm) to a micrometer scale (from 1 μm to 1 mm). According to an embodiment of the present disclosure, both of the diameter and length of the light-emitting diode ED may have nanometer scales or micrometer scales. In some other embodiments, the diameter of the light-emitting diode ED may have a nanometer scale, while the length of the light-emitting diode ED may have a micrometer scale. In some embodiments, the diameter and/or length of some of the light-emitting elements ED may have nanometer scales, while the diameter and/or length of some others of the light-emitting elements ED have micrometer scales.

According to an embodiment of the present disclosure, the light-emitting diode ED may be an inorganic light-emitting diode. The inorganic light-emitting diode may include a plurality of semiconductor layers. For example, the inorganic light-emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light.

According to an embodiment of the present disclosure, the above-described semiconductor layers may be sequentially stacked along the longitudinal direction of the light-emitting diode ED. The light-emitting diode ED may include a first semiconductor layer 31, an active layer 33, and a second semiconductor layer 32 sequentially stacked in the longitudinal direction, as shown in, for example, FIG. 8. The first semiconductor layer 31, the active layer 33, and the second semiconductor layer 32 may be a first conductivity type semiconductor layer, an active semiconductor layer, and a second conductivity type semiconductor layer described above, respectively.

The first semiconductor layer 31 may be doped with a first conductivity type dopant. The first conductivity type dopant may be Si, Ge, Sn, etc. According to an embodiment of the present disclosure, the first semiconductor layer 31 may include (or may be) n-GaN doped with n-type Si.

The second semiconductor layer 32 may be spaced apart from the first semiconductor layers 31 with the active layer 33 therebetween. The second semiconductor layer 32 may be doped with a second conductivity-type dopant, such as Mg, Zn, Ca, Se, and Ba. According to an embodiment of the present disclosure, the second semiconductor layer 32 may include (or may be) p-GaN doped with p-type Mg.

The active layer 33 may include a material having a single or multiple quantum well structure. As described above, the active layer 33 may emit light as electron-hole pairs are combined therein in response to an electrical signal applied through the first semiconductor layer 31 and the second semiconductor layer 32.

In some embodiments, the active layer 33 may have a structure in which a semiconductor material having a large band gap energy and a semiconductor material having a small band gap energy are alternately stacked on one another and may include other Group III to Group V semiconductor materials depending on the wavelength range of the emitted light.

The light emitted from the active layer 33 may exit not only through the outer surfaces of the light-emitting diode ED in the longitudinal direction but also through both side surfaces. For example, the directions in which light emitted from the active layer 33 propagates are not limited to one direction.

The light-emitting diode ED may further include an element electrode layer 37 disposed on the second semiconductor layer 32. The element electrode layer 37 may contact the second semiconductor layer 32. The element electrode layer 37 may be an ohmic contact electrode but is not limited to it. In some embodiments, the element electrode layer 37 may be a Schottky contact electrode.

When the both ends of the light-emitting diode ED are electrically connected to the contact electrodes 710 and 720 to apply electric signals to the first and second semiconductor layers 31 and 32, the element electrode layer 37 may be disposed between the second semiconductor layer 32 and the second contact electrode 720 to reduce the resistance therebetween. The element electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The element electrode layer 37 may include a semiconductor material doped with n-type or p-type impurities.

The light-emitting diode ED may further include an insulating film 38 surrounding the outer peripheral surfaces of the first semiconductor layer 31, the second semiconductor layer 32, the active layer 33, and/or the element electrode layer 37. The insulating film 38 may be disposed to surround at least the outer surface of the active layer 33 and may be extended in a direction in which the light-emitting diode ED is extended. The insulating film 38 may protect the above-described elements. The insulating film 38 may include (or may be made of) materials having insulating properties and may prevent or substantially prevent an electrical short-circuit that may occur when the active layer 33 contacts an electrode through which an electric signal is transmitted to the light-emitting diode ED. In addition, because the insulating film 38 includes the active layer 33 to protect the outer peripheral surfaces of the first and second semiconductor layers 31 and 32, it is possible to prevent or substantially prevent a decrease in luminous efficiency.

Figure 9:
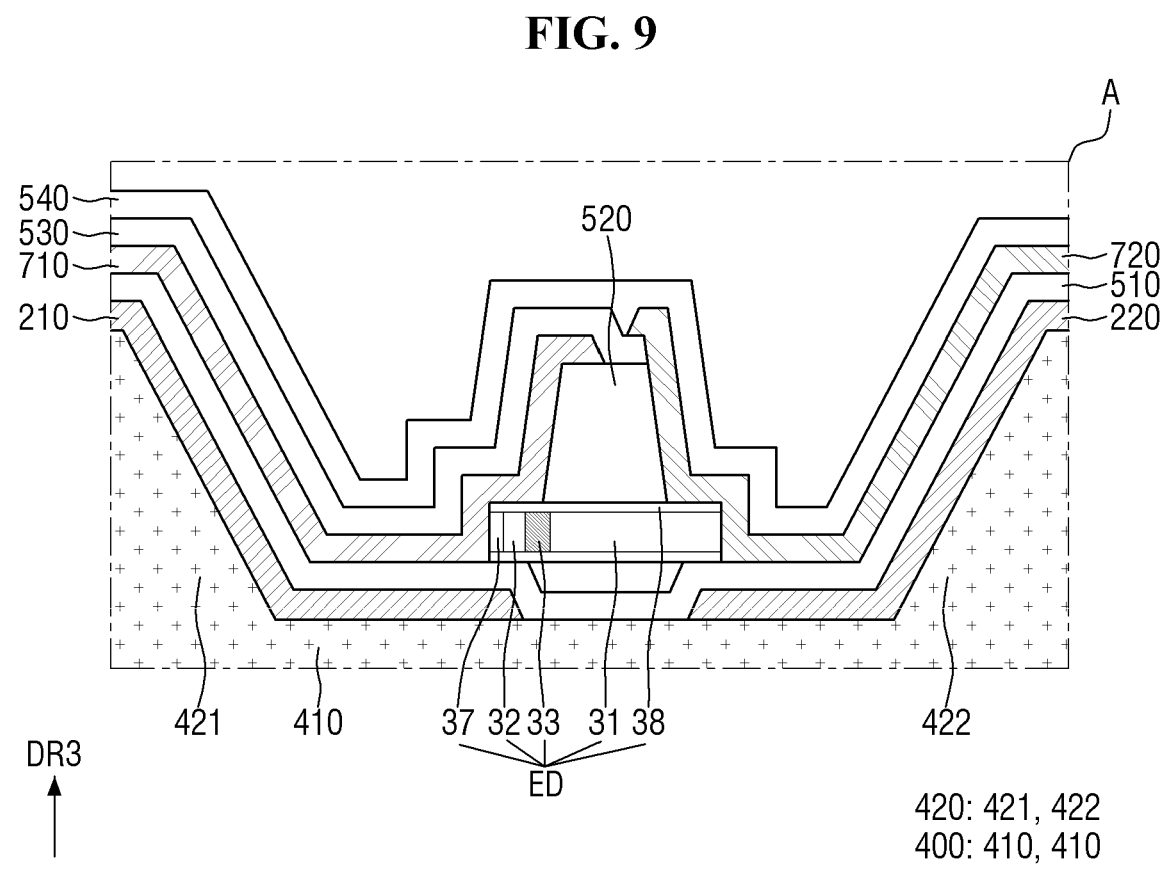

FIG. 9 is an enlarged, cross-sectional view showing the area A of FIG. 5.

Referring to FIG. 9, the light-emitting diode ED may be arranged such that it is extended in parallel to the substrate SUB. The plurality of semiconductor layers included in the light-emitting diodes ED may be disposed sequentially in the direction parallel to the upper surface of the substrate SUB. For example, the first semiconductor layer 31, the active layer 33, the second semiconductor layer 32, and the element electrode layer 37 of the light-emitting diode ED may be arranged sequentially in the direction parallel to the surface of the substrate SUB in the cross section passing through the both ends. The light-emitting diode ED may be disposed such that a first end of the light-emitting diode ED where the second semiconductor layer 32 is disposed is placed on the first electrode 210, while a second end of the light-emitting diode ED where the first semiconductor layer 31 is disposed is placed on the second electrode 220. It is, however, to be understood that the present disclosure is not limited thereto. Some light-emitting diodes ED may be disposed such that first ends of the light-emitting diodes ED where the second semiconductor layer 32 is disposed may be placed on the second electrode 220, while second ends of the light-emitting diodes ED where the first semiconductor layer 31 is disposed may be placed on the first electrode 210. The both ends of the light-emitting diode ED exposed by the second insulating layer 52 may contact the first contact electrode 710 and the second contact electrode 720, respectively.

The first contact electrode 710 may contact the first end of the light-emitting diode ED. The first contact electrode 710 may contact the element electrode layer 37 located at the first end of the light-emitting diode ED. The first contact electrode 710 may be electrically connected to the second semiconductor layer 32 through the element electrode layer 37 of the light-emitting diode ED.

The second contact electrode 720 may contact the second end of the light-emitting diode ED. The second contact electrode 720 may contact the first semiconductor layer 31 located at the second end of the light-emitting diode ED. The second contact electrode 720 may be electrically connected to the first semiconductor layer 31 of the light-emitting diode ED.

The first end of the light-emitting diode ED where the second semiconductor layer 32 is located may be electrically connected to the first electrode 210 through the first contact electrode 710, while the second end of the light-emitting diode ED where the first semiconductor layer 31 is located may be electrically connected to the second electrode 220 through the second contact electrode 720. For example, because the both ends of the light-emitting diode ED contact the first contact electrode 710 and the second contact electrode 720, respectively, the light-emitting diode ED may receive electrical signals from the first and second electrodes 210 and 220 and light may be emitted from the active layer 33 of the light-emitting diode ED according to the electric signals.

Figure 10:
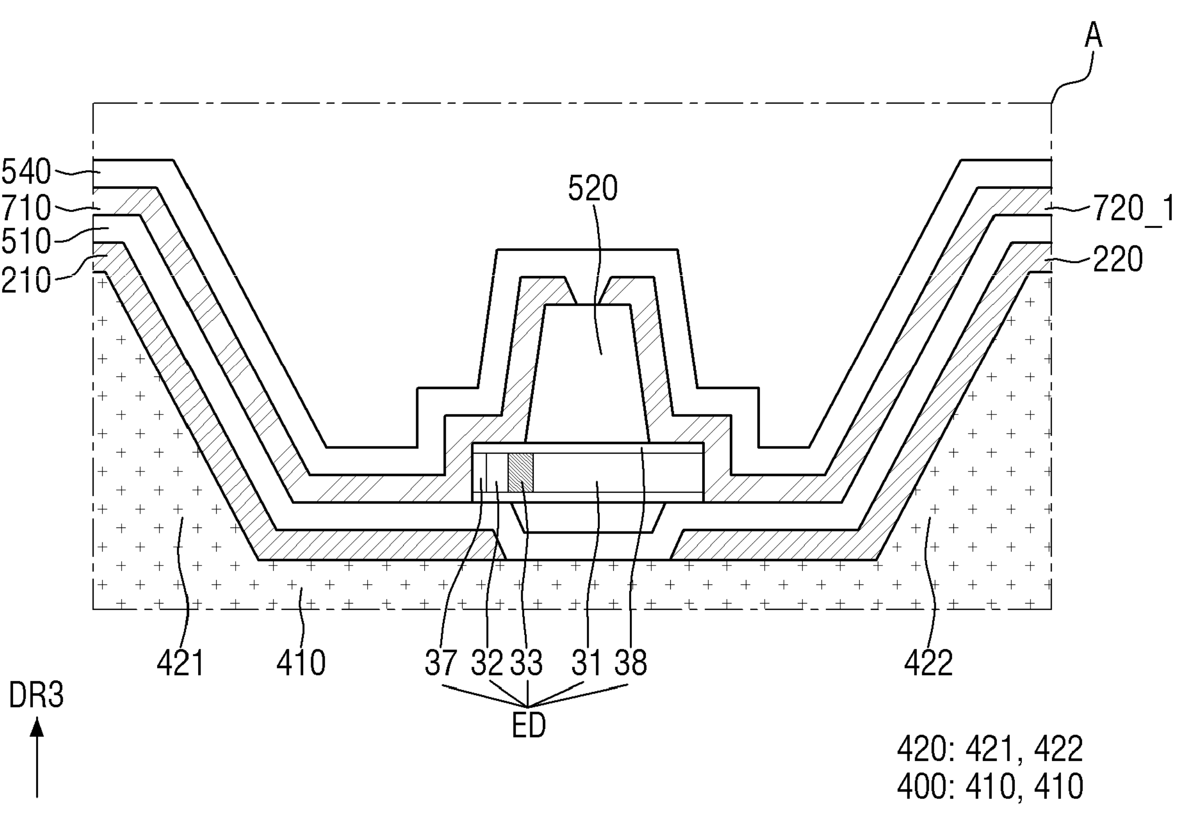
FIG. 10 is an enlarged, cross-sectional view showing the area A of FIG. 5 according to another embodiment.

FIG. 10 is an enlarged, cross-sectional view showing the area A of FIG. 5 according to another embodiment.

The embodiment shown in FIG. 10 is different from the embodiment shown in FIG. 9 in that the third insulating layer 530 is omitted.

For example, the first and second contact electrodes 710 and 720_1 may be disposed directly on the second insulating layer 520. The first contact electrode 710 and the second contact electrode 720_1 may be spaced apart from each other on the second insulating layer 520 to expose a part of the second insulating layer 520. The exposed part of the second insulating layer 520 between the first and second contact electrodes 710 and 720_1 may contact the fourth insulating layer 540.

According to this embodiment, even though the third insulating layer 530 is omitted, the second insulating layer 520 includes an organic insulating material to fix the light-emitting diode ED. The first contact electrode 710 and the second contact electrode 720_1 may be patterned via a single mask process and formed together (e.g., formed concurrently or simultaneously). Accordingly, no additional mask process is required to form the first contact electrode 710 and the second contact electrodes 720_1, and thus, the efficiency of the fabrication process can be improved. This embodiment is identical to the embodiment shown in FIG. 9 except that the third insulating layer 530 is omitted; and, therefore, the redundant descriptions will be omitted.

Hereinafter, a method of fabricating a display device 10 described above will be described.

FIGS. 11 to 22 are cross-sectional views showing processing steps of a method of fabricating the display device shown in FIG. 5.

Figure 11:
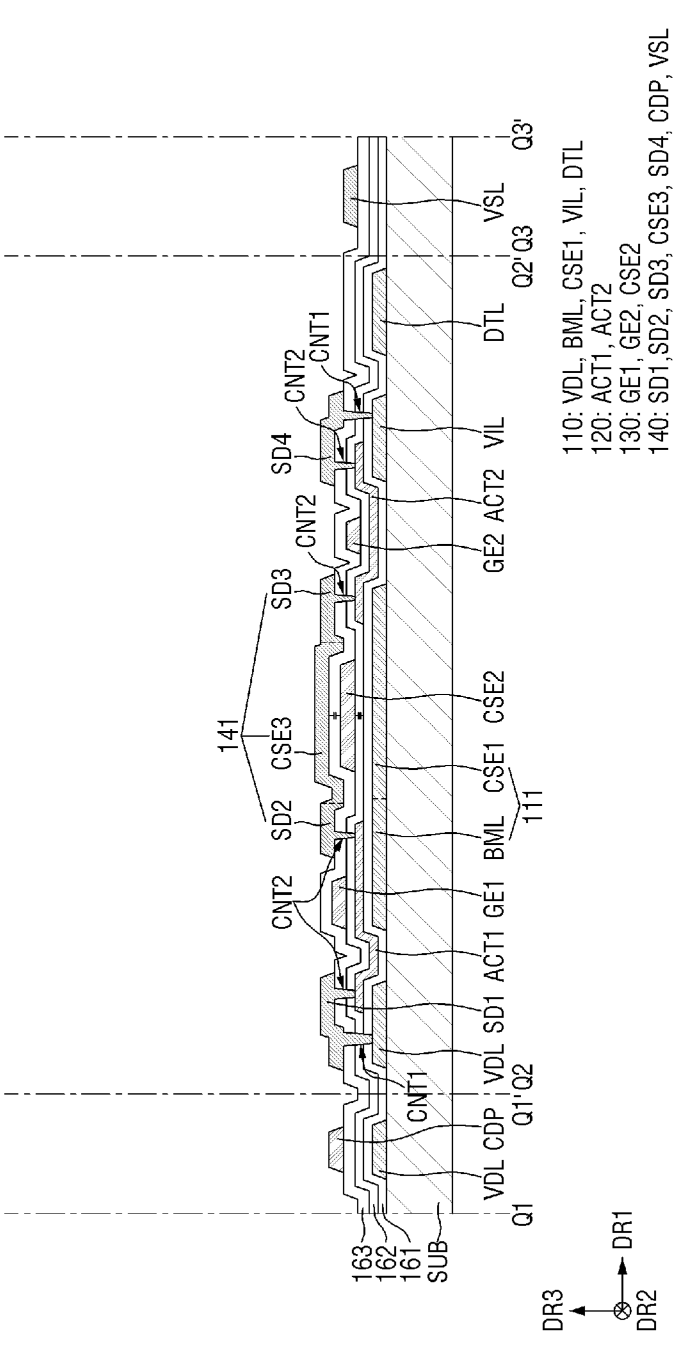

Initially, referring to FIG. 11, a substrate SUB is prepared, and a plurality of conductive layers 110, 130, and 140, a semiconductor layer 120, a buffer layer 161, and a plurality of insulating layers 162 and 163 are formed on the substrate SUB.

A patterned first conductive layer 110 is formed on the substrate SUB. The first conductive layer 110 may be formed by a mask process. For example, a material layer for the first conductive layer may be deposited entirely on the substrate SUB and may then be patterned via a photolithography process to form the patterned first conductive layer 110 as shown in FIG. 11.

Subsequently, the buffer layer 161 is formed over the whole surface of the substrate SUB on which the first conductive layer 110 is formed. Subsequently, a patterned semiconductor layer 120 is formed on the buffer layer 161. The semiconductor layer 120 may be formed via a mask process. For example, a material layer for the semiconductor layer may be deposited entirely on the buffer layer 161 and then patterned via a photolithography process to form the patterned semiconductor layer 120 as shown in FIG. 11.

Subsequently, a gate insulator 162 is formed on the buffer layer 161 on which the semiconductor layer 120 is formed. Subsequently, a patterned second conductive layer 130 is formed on the gate insulator 162. The second conductive layer 130 may be formed via a mask process. For example, a material layer for the second conductive layer may be deposited entirely on the gate insulator 162, and may then be patterned via a photolithography process to form the patterned second conductive layer 130 as shown in FIG. 11.

Subsequently, the interlayer insulating film 163 is stacked on the gate insulator 162 on which the patterned second conductive layer 130 is formed, and a first contact opening CNT1 exposing a part of the first conductive layer 110 (e.g., the first voltage line VDL the initialization voltage line VIL) and a second contact opening CNT3 exposing a part of the semiconductor layer 120 (e.g., the source and drain regions of the first active layer ACT1 and the source and drain regions of the second active layer ACT2) may be formed. The process of forming the contact openings CNT1 and CNT2 may include (or may be) a mask process.

The first contact opening CNT1 and the second contact opening CNT2 may be sequentially formed with different masks. For example, an insulating layer for an interlayer insulating film is entirely deposited on the buffer layer 161 on which the second conductive layer 130 is formed. Subsequently, a first photoresist pattern exposing a part of the first conductive layer 110 is formed on the insulating layer for an interlayer insulating film, and the first contact opening CNT1 exposing a part of the first conductive layer 110 may be formed by etching the insulating layer for the interlayer insulating film, the gate insulator 162, and the buffer layer 161 by using it as an etching mask. Subsequently, after removing the first photoresist pattern, a second photoresist pattern exposing a part of the semiconductor layer 120 is formed on the insulating layer for the interlayer insulating film, and the second contact opening CNT2 may be formed by etching the insulating layer for the interlayer insulating film and the gate insulator 162 by using it as an etching mask.

The first contact opening CNT1 and the second contact opening CNT2 may be formed with the same mask. In such an embodiment, no additional mask process is necessary to form the first contact electrode CNT1 and the second contact electrodes CNT2, and thus, the efficiency of the fabrication process can be improved. It is to be noted that the semiconductor layer 120 may be exposed to an etchant while etching the buffer layer 161 to form the first contact opening CNT1.

Subsequently, a patterned third conductive layer 140 is formed on the interlayer insulating film 163. The patterned third conductive layer 140 may be formed via a mask process. For example, a material layer for the third conductive layer is deposited entirely on the interlayer insulating film 163. During the deposition process, the material layer for the third conductive layer may be deposited even to the inside of the first contact opening CNT1 and the second contact opening CNT2 to be connected to the first conductive layer 110 and the semiconductor layer 120. Subsequently, a photoresist layer is applied onto the material layer for the third conductive layer, and a photoresist pattern is formed by exposure and development. Then, the material layer for the third conductive layer is etched by using it as an etch mask. Subsequently, the photoresist pattern is removed via a strip or ashing process, to complete the patterned third conductive layer 140 as shown in FIG. 11.

Subsequently, referring to FIGS. 12 to 15, a passivation layer 164 and a first organic planarization layer 165 having an opening (e.g., a through-hole) including a first opening HA1 and a third opening HA3 is formed on the interlayer insulating film 163 on which the third conductive layer 140 is formed.

Figure 12:
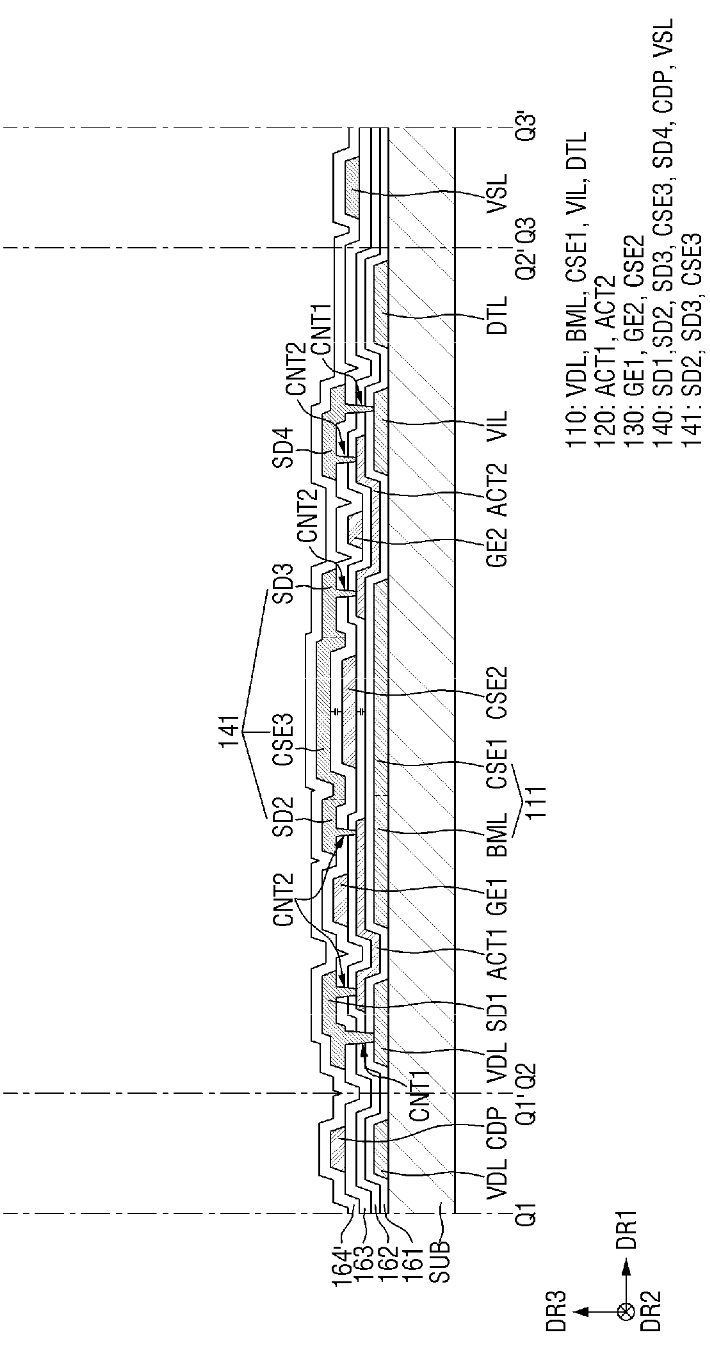

For example, referring to FIG. 12, a material layer 164' for the passivation layer is disposed entirely on the interlayer insulating film 163 on which the third conductive layer 140 is formed.

Figure 13:
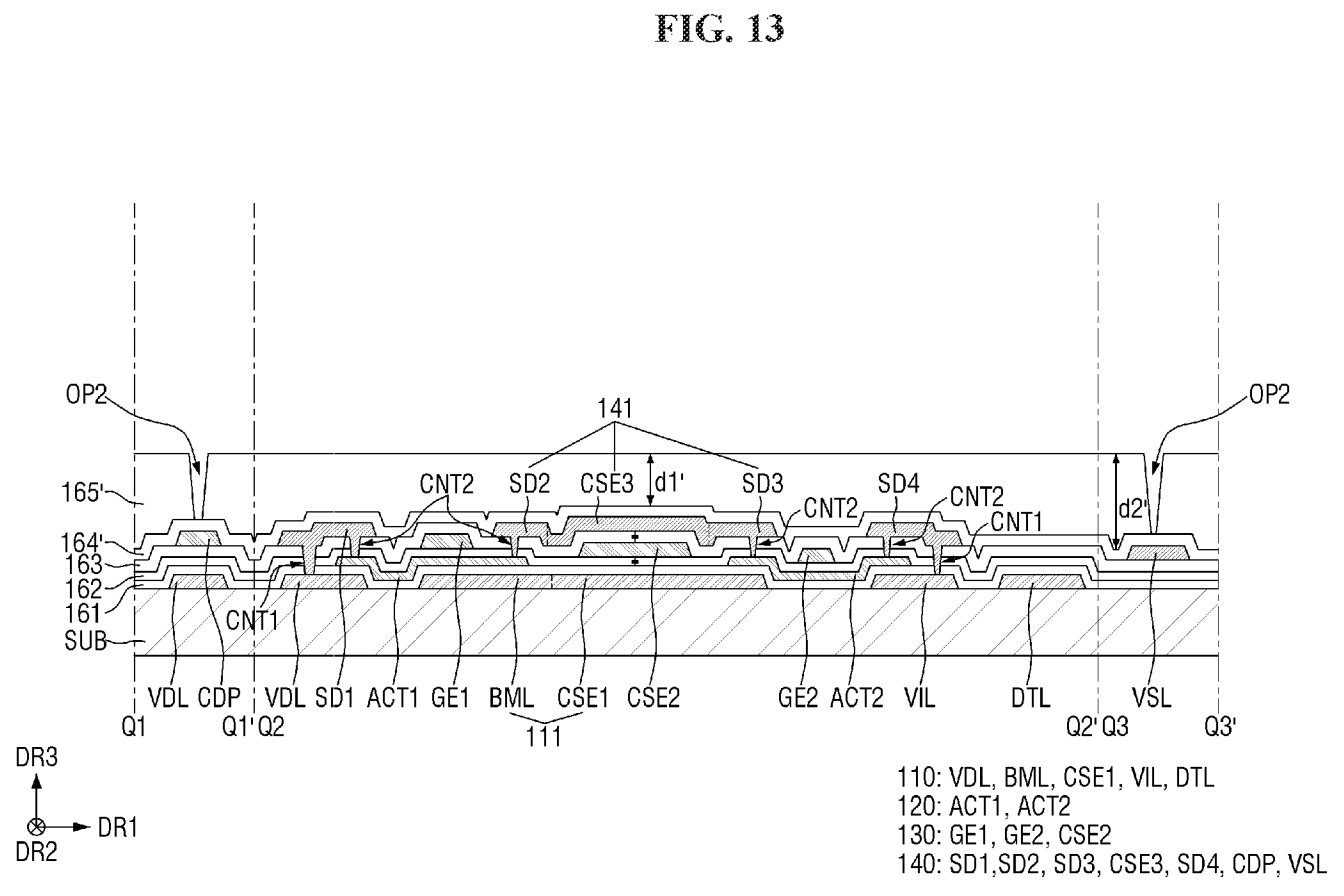

Subsequently, referring to FIG. 13, a patterned first organic planarization material layer 165' is formed on the material layer 164' for the passivation layer. The first organic planarization layer 165' has a plurality of openings OP2 including at a location where the first contact opening CNT1 is formed through which the third conductive layer 140 is electrically connected to the first electrode 210 and at a location where the second contact opening CNT2 is formed through which the third conductive layer 140 is electrically connected to the second electrode 220, respectively. For example, the plurality of second openings OP2 may overlap with a part of the conductive pattern CDP of the third conductive layer 140 and a part of the second voltage line VSL in the third direction DR3.

The first organic planarization material layer 165' may include, for example, an organic material including (or containing) a photosensitive material. The patterned first organic planarization layer material layer 165' having the plurality of second openings OP2 may be formed by applying a first organic material layer and then forming the plurality of second openings OP2 by exposure and development.

The first organic planarization material layer 165' may have a generally flat surface regardless of the shape or presence of patterns disposed thereunder. The first organic planarization material layer 165' may have different thicknesses across different regions according to the shape or presence of patterns of the plurality of conductive layers 110, 130, and 140 disposed thereunder. For example, the first thickness d1' of the part of the first organic planarization material layer 165' at where the first to third conductive layers 110, 130, and 140 and the plurality of insulating films 161, 162, 163, and 164' all overlap one another in the third direction DR3 may be different from the second thickness d2' of the part of the first organic planarization material layer 165' at where the plurality of conductive layers is not disposed. Because the first organic planarization material layer 165' has a flat surface, the first thickness d1' of the first organic planarization material layer 165' may be smaller than the second thickness d2' of the first organic planarization material layer 165'.

Figure 14:
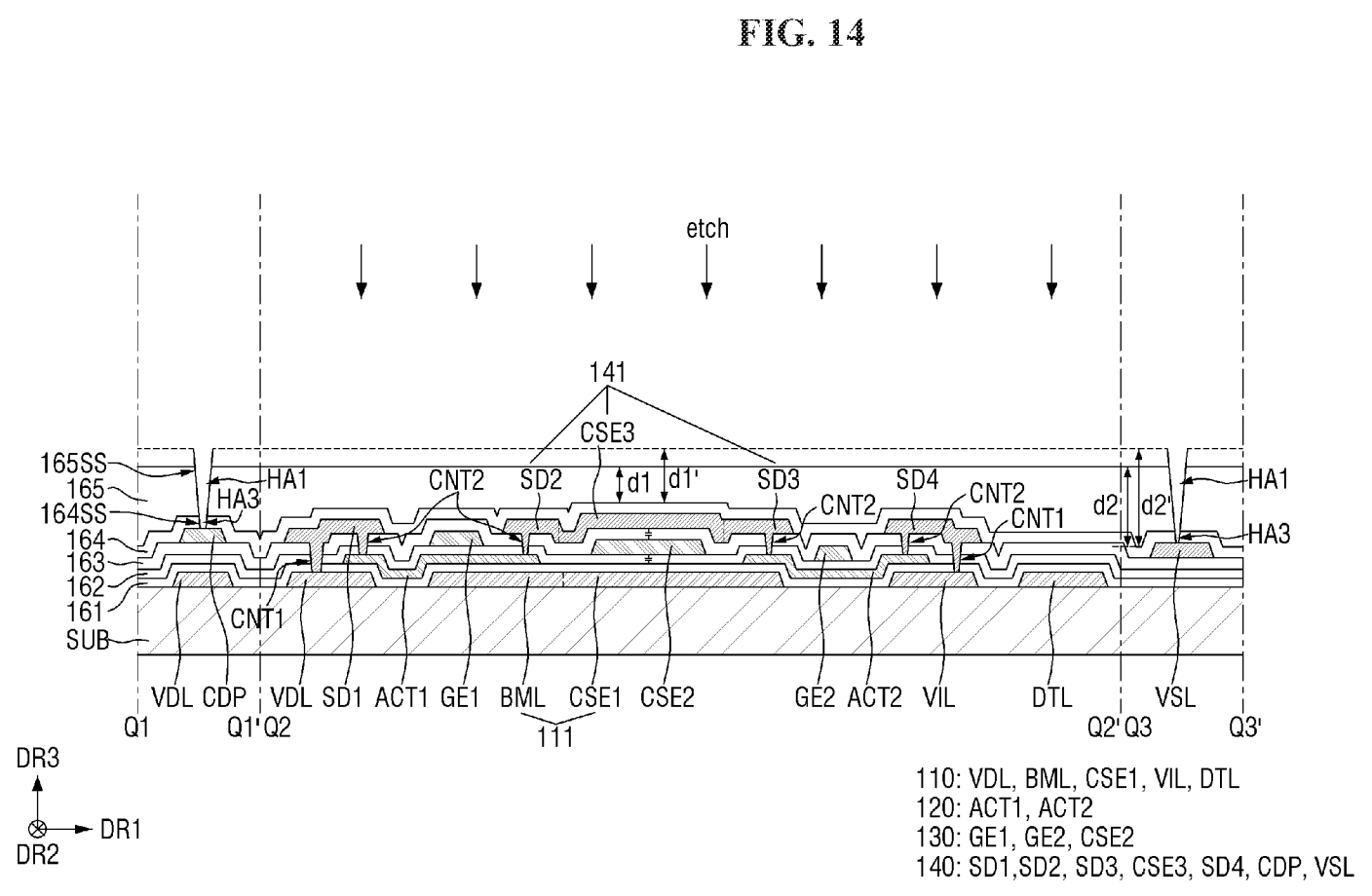
Figure 15:
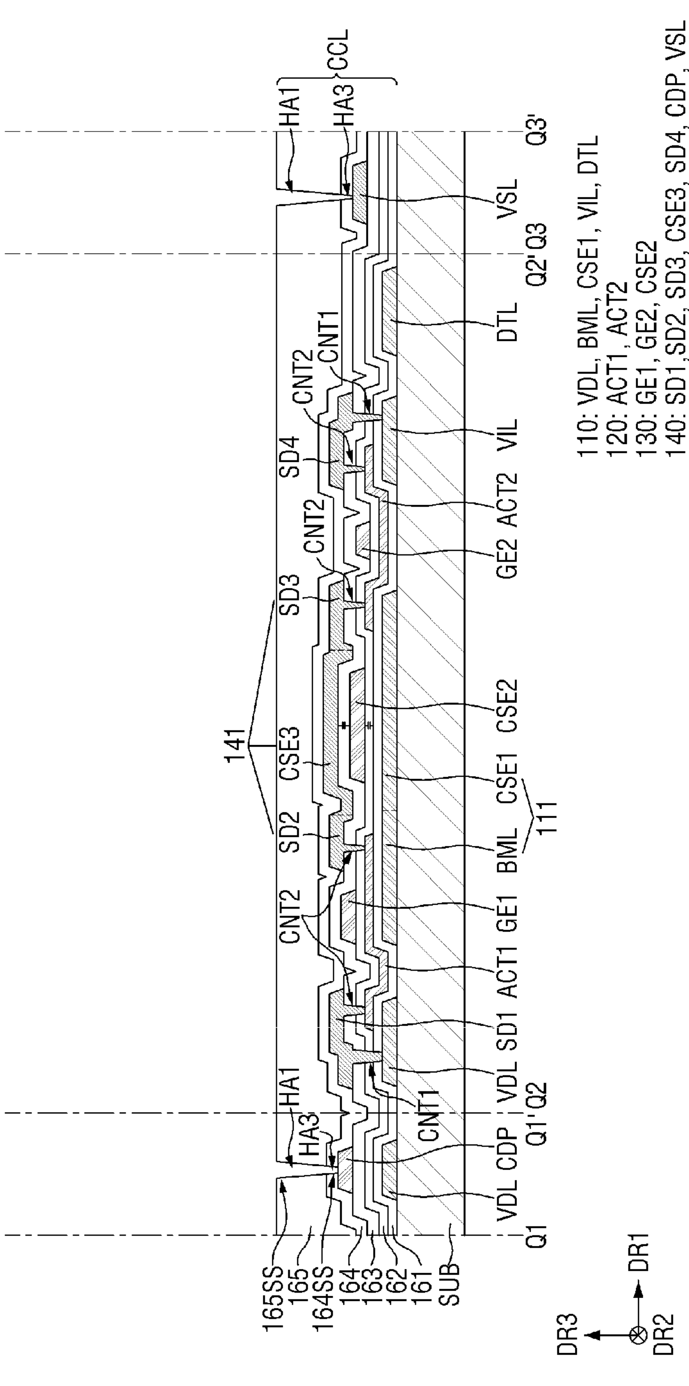

Subsequently, referring to FIGS. 14 and 15, etching is carried out on the entire surface by using the first organic planarization material layer 165' as an etching mask to form the patterned first organic planarization layer 165 and the patterned passivation layer 164. Although not limited thereto, the etching may be carried out by dry etching.

During this etching process, the material layer 164' for the passivation layer 164 exposed by the second opening OP2 is etched out to form the first opening HA1 and the third opening HA3 exposing the surface of the conductive pattern CDP of the third conductive layer 140 and the surface of the second voltage line VSL, respectively. The sidewalls 164SS of the passivation layer 164 may form an opening (e.g., a through-hole) exposing a part of the third conductive layer 140 together with the sidewalls 165SS of the first organic planarization layer 165. For example, the opening may include the first opening HA1 defined by the sidewalls 165SS of the first organic planarization layer 165 and the third opening HA3 defined by the sidewalls 164SS of the passivation layer 164. The sidewalls 164SS of the passivation layer 164 forming the third opening HA3 and the sidewalls 165SS of the first organic planarization layer 165 forming the first opening HA1 may be aligned in line with each other. The opening formed of the first opening HA1 and the third opening HA3 formed during this process may form each of the first electrode contact opening CT1 and the second electrode contact opening CT2 along with the second opening HA2 penetrating the second organic planarization layer 410 of the organic layer 400, to be described later.

In addition, during this process, the first organic planarization material layer 165' exposed to the etching may also be etched together with the material layer 164' for the passivation layer to reduce its height (or thickness). The first thickness d1 of the part of the first organic planarization layer 165 at where the first to third conductive layers 110, 130, and 140 and the plurality of insulating films 161, 162, 163, and 164 all overlap one another in the third direction DR3 may be smaller than the second thickness d2 of the part of the first organic planarization layer 165 where the plurality of conductive layers is not disposed.

Subsequently, referring to FIGS. 16 and 17, a patterned organic layer 400 is formed on the patterned first organic planarization layer 165. The patterned organic layer 400 may include (or may be made of), for example, an organic material including a photosensitive material. In such an embodiment, the patterned organic layer 400 may be formed by applying a second organic material layer 400' and then performing the exposure and development. The organic layer 400 having different heights for different regions may be formed using a halftone mask, a multi-tone mask, a slit mask, etc. For example, the forming of the patterned organic layer 400 may include applying a second organic material layer and exposing and developing the second organic material layer by using a halftone mask MK.

Figure 16:
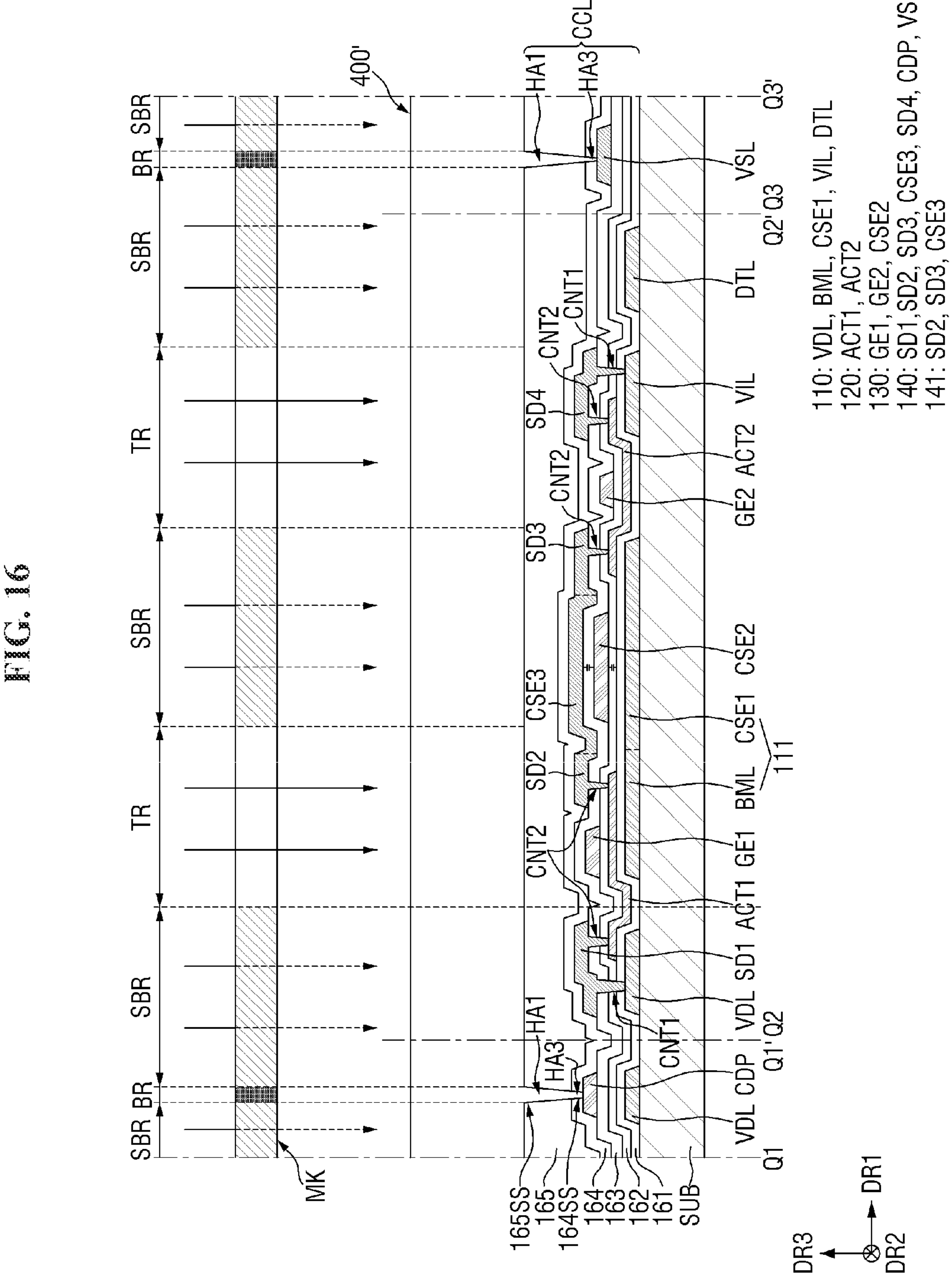
Figure 17:
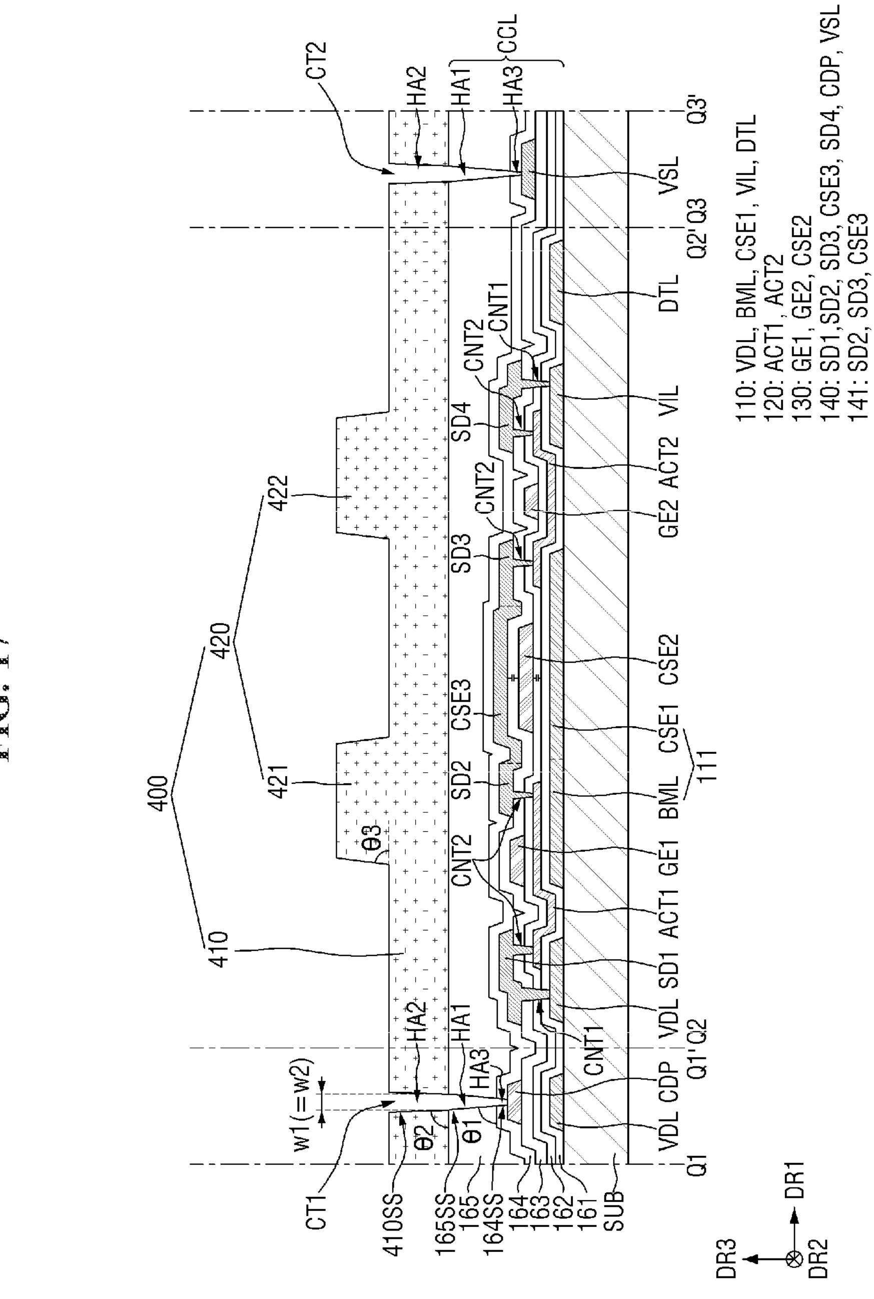

For example, referring to FIG. 16, the second organic material layer 400' may be entirely applied on the patterned first organic planarization layer 165, and then, the second organic material layer 400' may be exposed to light and developed using a photomask MK to form the patterned organic layer 400.

Initially, the photomask MK is prepared. The photomask MK may include a plurality of regions BR, SBR, and TR having different light transmittances. The photomask MK may include transmitting regions TR, semi-blocking regions SBR, and blocking regions BR according to the transmittance (or transparency) of light. The transmittance of the blocking regions BR may be less than the transmittances of the transmitting regions TR and semi-blocking regions SBR. For example, the blocking regions BR may block substantially all of the light provided from the outside (e.g., may have a transmittance of approximately 0%), the transmitting regions TR may transmit substantially all of the light provided from the outside (e.g., may have a transmittance of approximately 100%), and the semi-blocking regions SBR may transmit a part of (or some of) the light provided from the outside while blocking the other part of (or some of) the light (e.g., may have a transmittance of approximately 40% to 60%). It is, however, to be understood that the present disclosure is not limited thereto. The blocking regions BR may transmit some of the light, with a transmittance significantly less than that of each of the transmitting regions TR and the semi-blocking regions SBR.

Subsequently, the photomask MK may be placed above the second organic material layer 400', and an exposure process may be carried out.

The photomask MK may be disposed such that the blocking regions BR are in line with the third opening HA3 penetrating the passivation layer 164 and the first opening HA1 penetrating the first organic planarization layer 165 and the transmitting regions TR are in line with the first bank 420. For example, regions at where the second organic material layer 400' is to remain may be in line with the transmitting regions TR, regions where the second organic material layer 400' is to be removed may be in line with the blocking regions BR, and the other regions may be in line with the semi-blocking regions SBR.

The blocking regions BR block light provided from the outside and overlap with the areas at where the first and second electrode contact openings CT1 and CT2 are to be formed so that the light cannot reach some areas of the second organic material layer 400' overlapping the first opening HA1 and the third opening HA3. The transmitting regions TR transmit most of the light provided from the outside so that most of the light can reach some other areas of the second organic material layer 400' overlapping the area where the first bank 420 is to be formed. In addition, the semi-blocking regions SBR transmit a part of the light provided from the outside and block the other parts of the light so that some light can reach other areas of the second organic material layer 400'. After the exposure process is carried out, the areas of the second organic material layer 400' in line with the blocking regions BR are not exposed to light so that the material is maintained and can be easily dissolved in a developer. Some other areas of the second organic material layer 400' in line with the transmitting regions TR may be extended exposed to light and, thus, may not be easily dissolved due to exposure. The other areas of the second organic material layer 400' in line with the semi-blocking regions SBR may be exposed to light and, thus, may have a smaller thickness that the second organic material layer 400' in line with the transmitting regions TR and may not be easily dissolved. Accordingly, some areas of the second organic material layer 400' in line with the blocking regions BR may be dissolved in the developer and removed, whereas some other areas of the second organic material layer 400' in line with the semi-blocking regions SBR and the transmitting regions TR remain without being dissolved in the developer. Subsequently, the patterned organic layer 400 as shown in FIG. 17 can be formed via a developing process.

Figure 18:
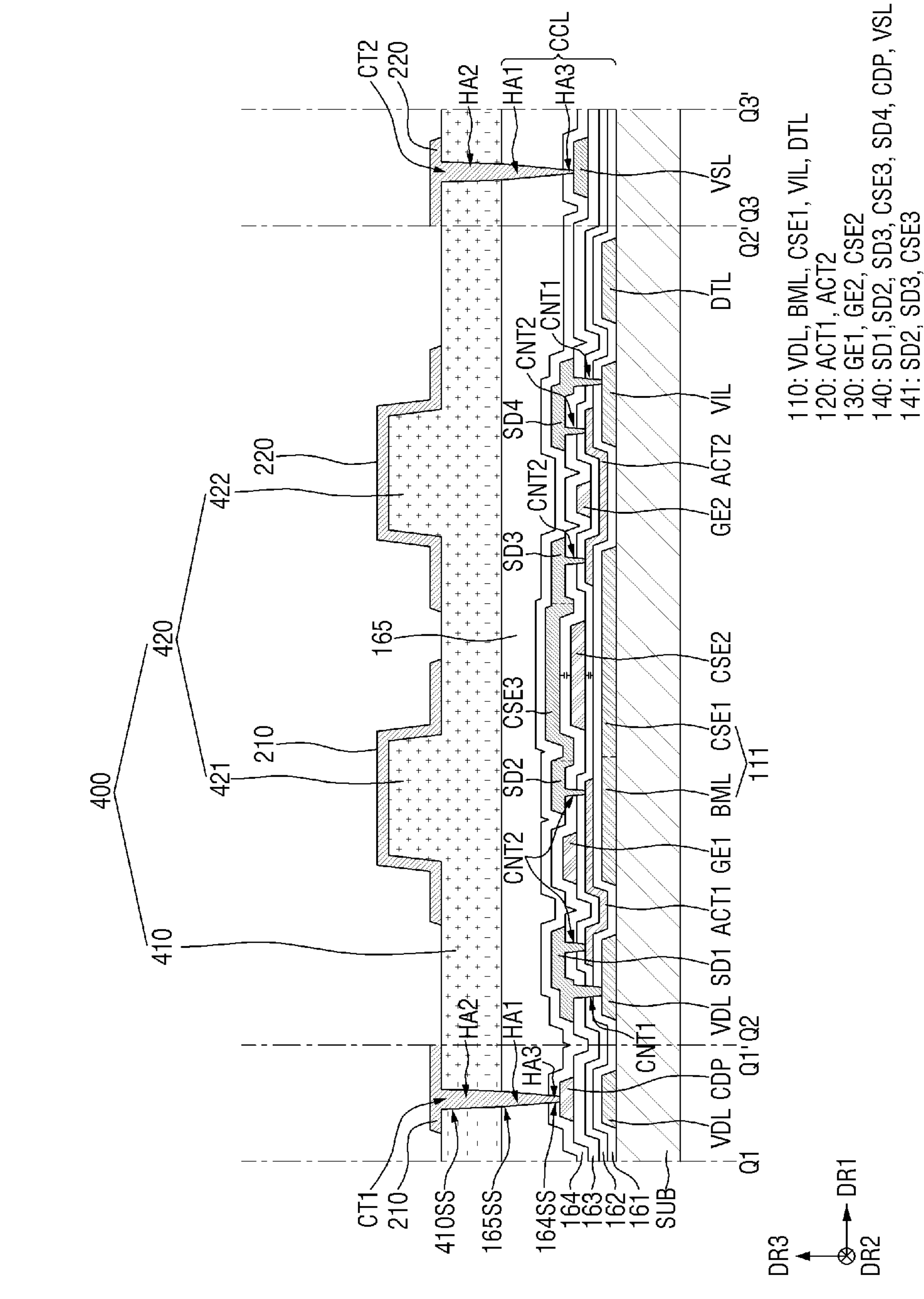

Subsequently, referring to FIG. 18, a first electrode 210 and a second electrode 220 are formed on the patterned organic layer 400. The patterned first electrode 210 and second electrode 220 may be formed via a mask process. For example, a material layer for an electrode layer is deposited entirely on the organic layer 400. During the deposition process, the material layer forming the electrode layer may be deposited even to the inside of the first electrode contact opening CT1 and the second electrode contact opening CT2 penetrating the passivation layer 164, the first organic planarization layer 165, and the second organic planarization layer 410 so that the electrode layer may be connected to the first conductive pattern CDP and the second voltage line thereunder. Subsequently, after applying a photoresist layer on the material layer for the electrode layer, a photoresist pattern is formed by exposure and development, and then, the material layer for the electrode layer is etched by using it as an etching mask. Subsequently, the photoresist pattern is removed via a strip process or an ashing process to form the patterned first electrode 210 and second electrode 220, as shown in FIG. 18.

Figure 19:
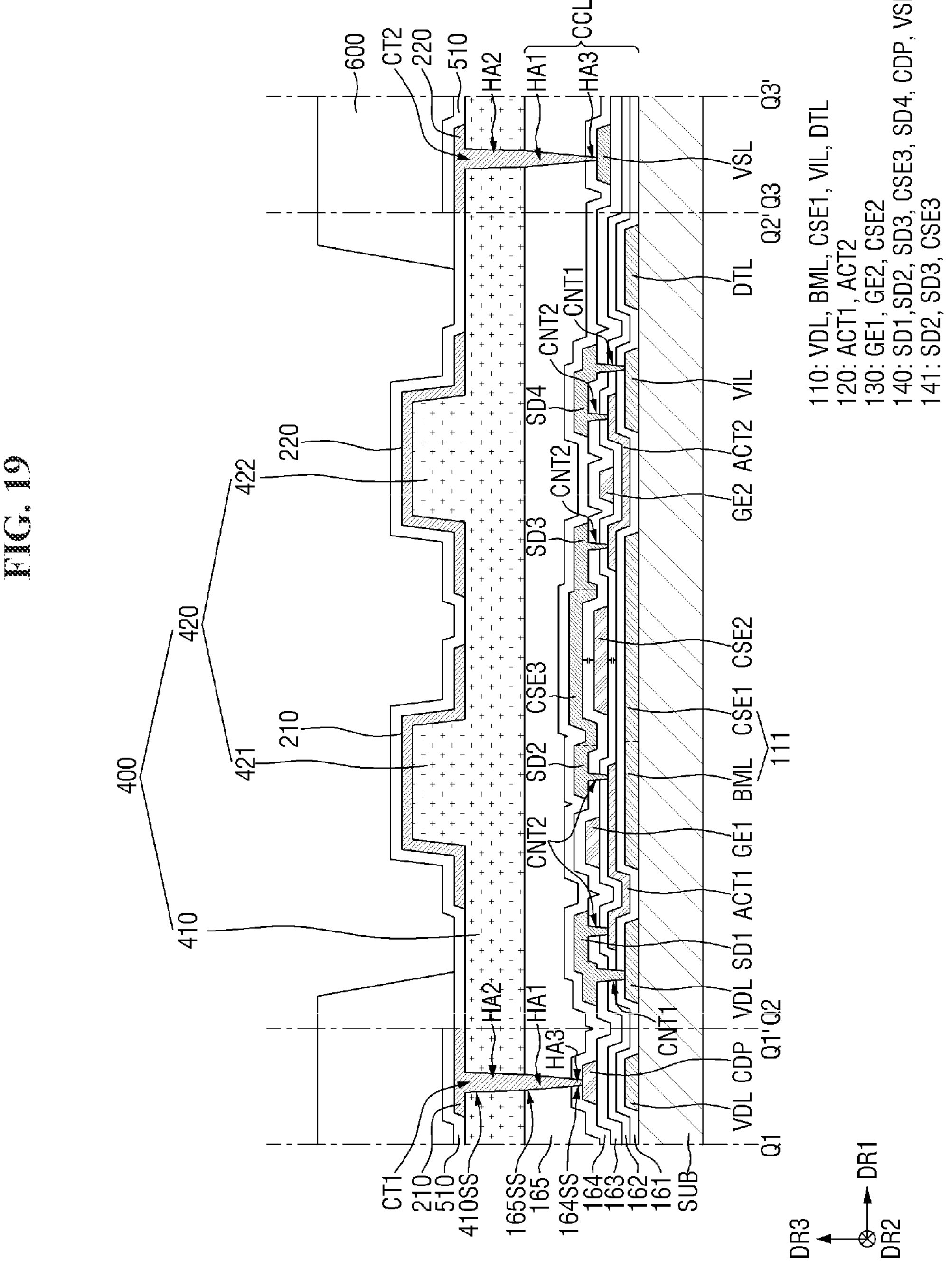

Subsequently, as shown in FIG. 19, a first insulating layer 510 is formed on the first and second electrodes 210 and 220, and a second bank 600 is formed. The first insulating layer 510 may be disposed to entirely cover the first electrode 210 and the second electrode 220 on the substrate SUB and may be partially patterned during a subsequent process to form the first insulating layer 510 as shown in FIGS. 5 and 7.

Figure 20:
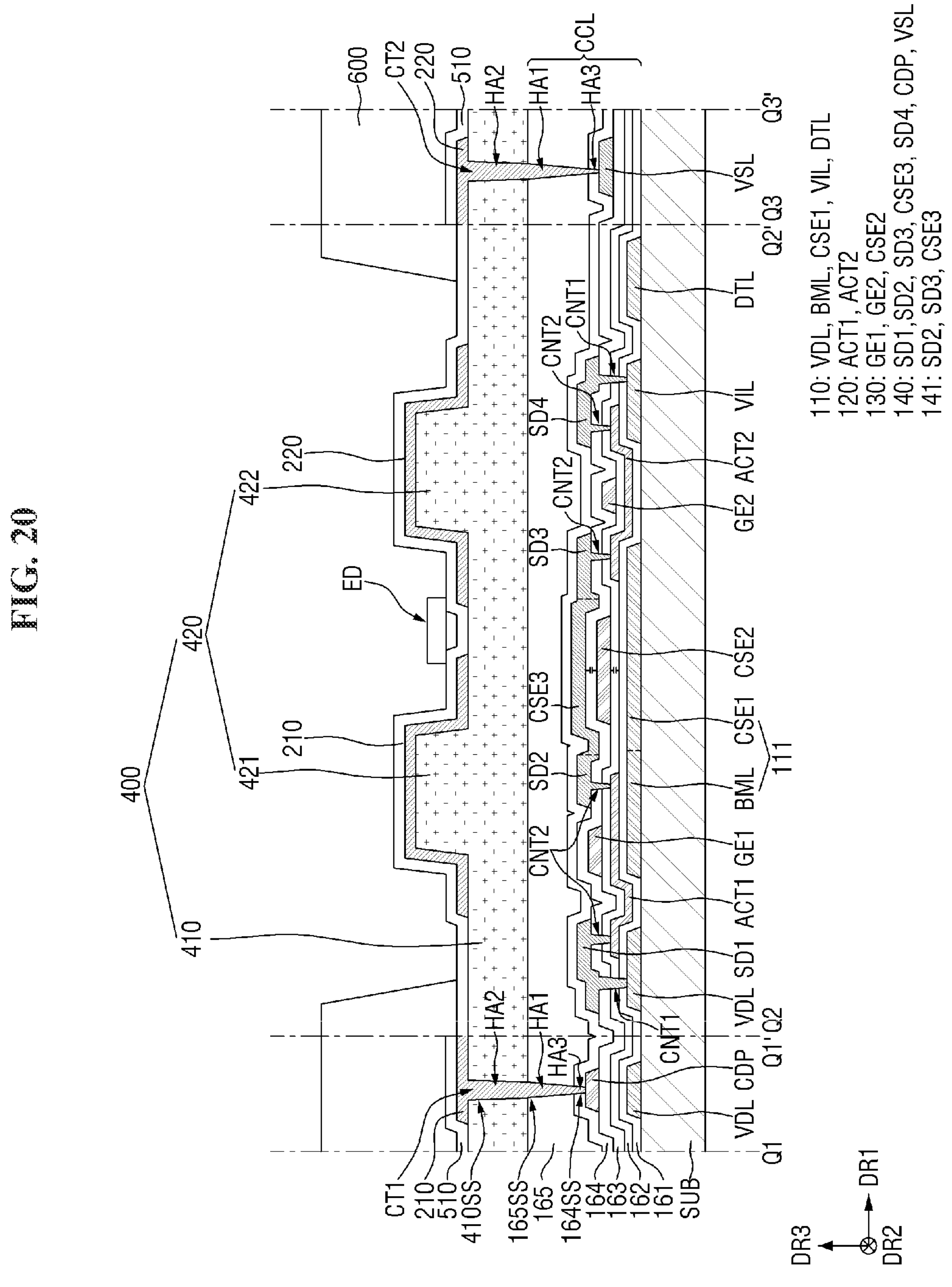

Subsequently, referring to FIG. 20, a light-emitting diode ED is disposed on the first bank 420 of the organic layer 400. For example, the light-emitting diode ED is disposed between a first sub-bank 421 and a second sub-bank 422 of the organic layer 400. The light-emitting diode ED may be disposed by using an inkjet process. For example, an ink in which the light-emitting diodes ED are dispersed is ejected into the emission area EMA partitioned by the second bank 600, and an alignment signal is applied between the first electrode 210 and the second electrode 220. Then, by using an electric field formed therebetween, the light-emitting diode ED may be aligned such that the both ends thereof are placed on the first electrode 210 and the second electrode 220, respectively.

Subsequently, referring to FIG. 21, a second insulating layer 520, a first contact electrode 710, and a third insulating layer 530 are formed on the light-emitting diode ED.

Figure 21:
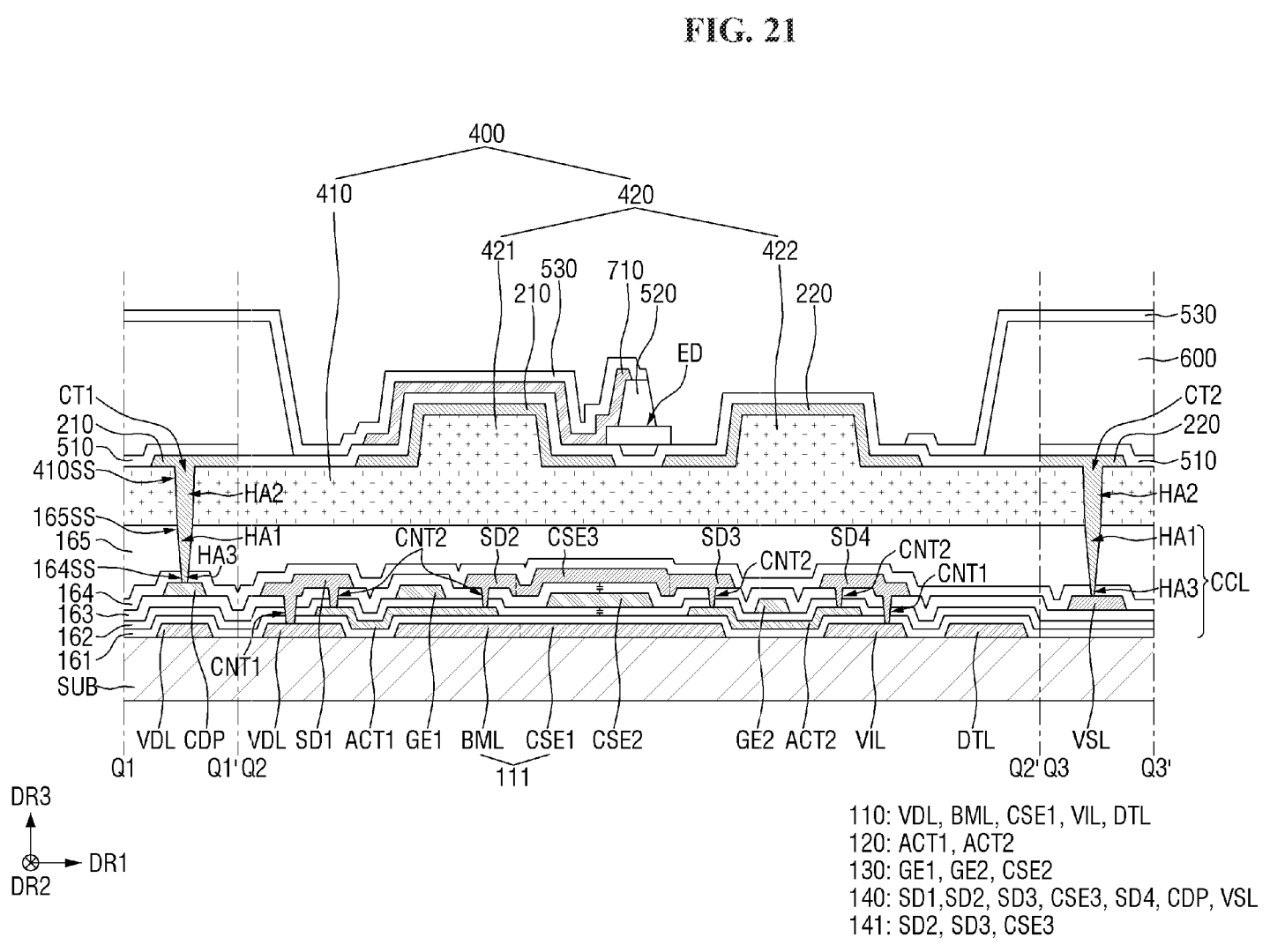

Initially, the second insulating layer 520 shown in FIG. 21 may be formed by stacking a second insulating material layer entirely on the substrate SUB on which the light-emitting diodes ED and the first insulating layer 510 are formed and, then, removing a part of the second insulating material layer so that the first ends and the second ends of the light-emitting diodes ED are exposed.

Subsequently, a first contact electrode 710 is formed on the second insulating layer 520. In an embodiment, the first contact electrode 710 may be formed via a mask process. For example, a material layer for the first contact electrode is disposed entirely on the substrate SUB. Subsequently, a photoresist layer is applied onto the material layer for the first contact electrode and a photoresist pattern is formed by exposure and development. Then, etching is carried out by using it as an etch mask. The material layer for the first contact electrode may be etched entirely by, but is not limited to, wet etching. Subsequently, the photoresist pattern may be removed via a strip process or an ashing process to form the first contact electrode 710 as shown in FIG. 21.

Subsequently, a third insulating layer 530 is formed on the first contact electrode 710. The patterned third insulating layer 530 may be formed by depositing a material layer for the third insulating layer entirely on the substrate SUB and forming an opening for exposing the first insulating layer 510 and the second end of the light-emitting diode ED on the second electrode 220.

Figure 22:
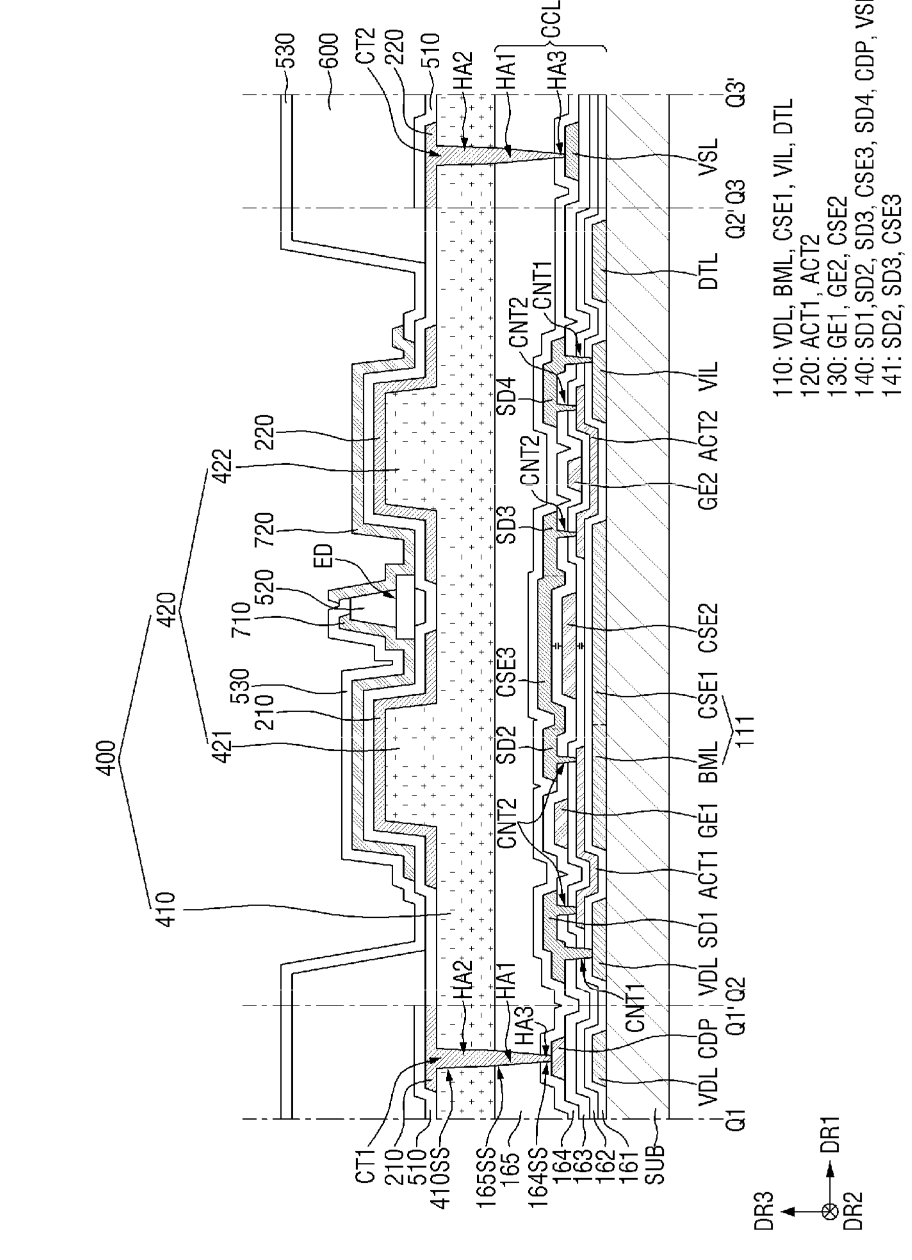

Subsequently, as shown in FIG. 22, a second contact electrode 720 is formed on the third insulating layer 530. In an embodiment, the second contact electrode 720 may be formed via a mask process. For example, a material layer for the second contact electrode is disposed entirely on the substrate SUB.

Subsequently, a photoresist layer is applied onto the material layer for the second contact electrode and a photoresist pattern is formed by exposure and development. Then, etching is carried out by using it as an etch mask. The material layer for the second contact electrode 720 may be etched entirely by, but is not limited to, wet etching. Subsequently, the photoresist pattern may be removed via a strip process or an ashing process to form the second contact electrode 720 as shown in FIG. 22.

Subsequently, a fourth insulating layer 540 is formed entirely on the substrate SUB, thereby fabricating the display device 10 as shown in FIG. 4.

According to the method of fabricating the display device 10 according to this embodiment, the etching process for forming the first opening HA1 may be carried out on the entire surface by using the patterned first organic planarization material layer 165' as an etching mask. Accordingly, the first organic planarization material layer 165' exposed to the etching may also be etched out together with the material layer 164' for the passivation layer to reduce its height (or thickness). When this happens, the thickness of the first organic planarization layer 165 is reduced, and thus, the thickness of the organic layer interposed between the third conductive layer 140 and the first and second electrodes 210 and 220 thereon may not be sufficient. As a result, coupling may occur between the conductive layer 140 and the first and second electrodes 210 and 220. In view of the above, according to the method of the display device 10 according to this embodiment, the second organic planarization layer 410 is further disposed on the first organic planarization layer 165 to prevent or substantially prevent coupling and a short circuit, which may occur between the third conductive layer 140 and the first and second electrodes 210 and 220. In addition, by forming the second organic planarization layer 410 and the first bank 420 via the same mask process, the efficiency of a process of fabricating the display device 10 can be improved.

Hereinafter, other embodiments of the present disclosure will be described. In the following description, the same or similar elements as those described above will be denoted by the same or similar reference numerals, and redundant descriptions thereof may be omitted or briefly provided. Descriptions will focus on differences from the above-described embodiments.

Figure 23:
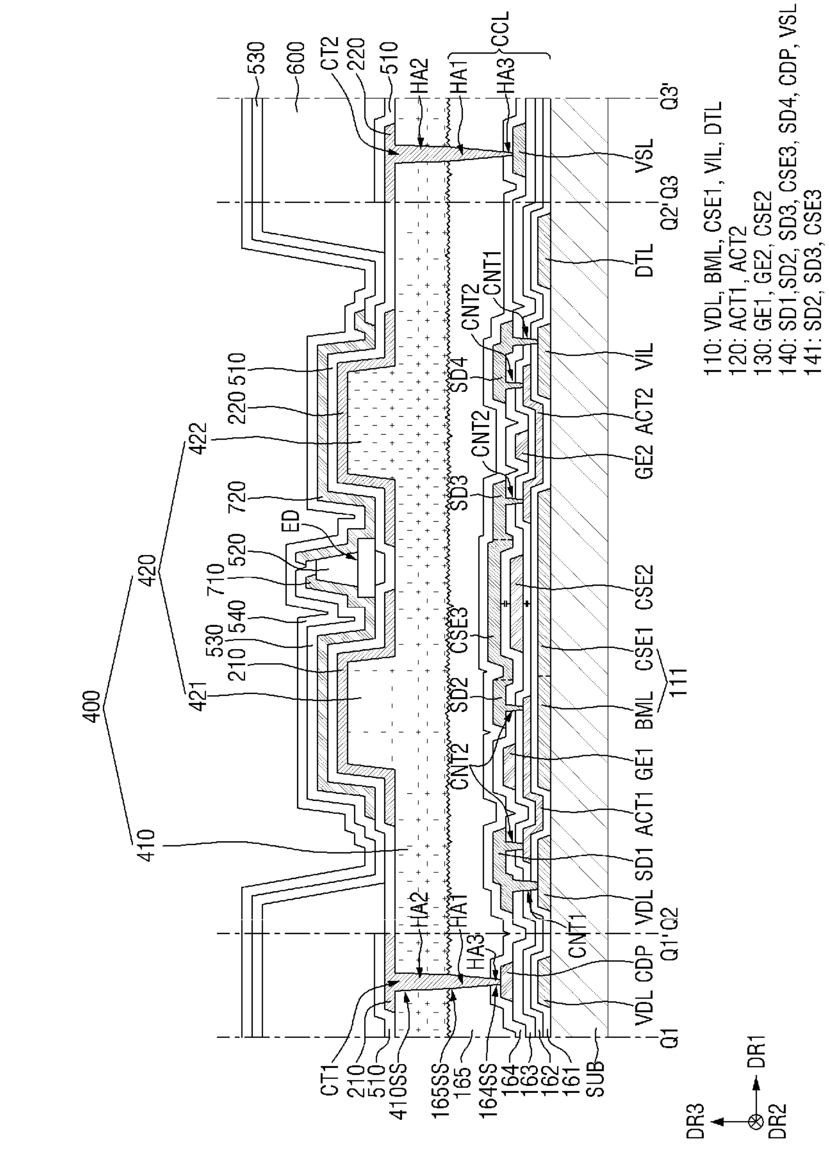
FIG. 23 is a cross-sectional view of a display device according to another embodiment of the present disclosure.

FIG. 23 is a cross-sectional view of a display device according to another embodiment of the present disclosure.

The embodiment shown in FIG. 23 is different from the embodiment shown in FIG. 5 in that certain surface roughness is formed on the upper surface of a first organic planarization layer 165_1.

For example, the surface roughness may be formed on the upper surface of the first organic planarization layer 165_1.

The surface roughness formed on the upper surface of the first organic planarization layer 165_1 may be formed via the process of forming the first opening HA1 and the third opening HA3 by etching the material layer 164' for the passivation layer described above with reference to FIGS. 13 and 14. For example, the process of etching the material layer 164' for the passivation layer may be carried out by etching entirely using the first organic planarization material layer 165' as an etching mask. Therefore, during the etching process, the upper surface (or surface) of the first organic planarization material layer 165' may be exposed to the etchant such that the certain surface roughness may be formed on the upper surface of the first organic planarization layer 165_1 as shown in FIG. 23.

According to this embodiment, even though the certain surface roughness is formed on the upper surface of the first organic planarization layer 165_1, the second organic planarization layer 410 of the organic layer 400 may be disposed on the upper surface of the first organic planarization layer 165_1 to provide a flat surface.

Figure 24:
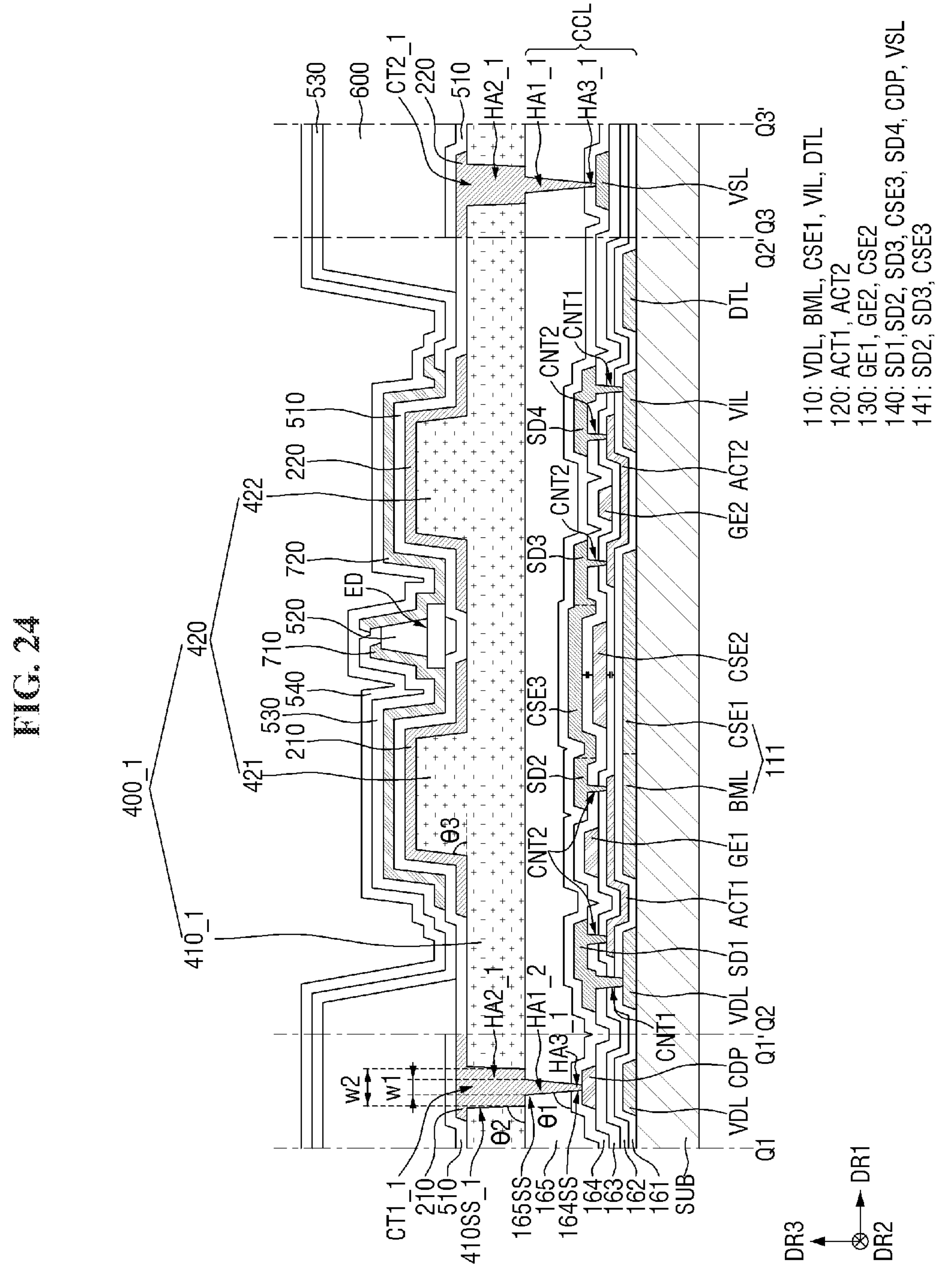
FIG. 24 is a cross-sectional view of a display device according to another embodiment of the present disclosure.
Figure 25:
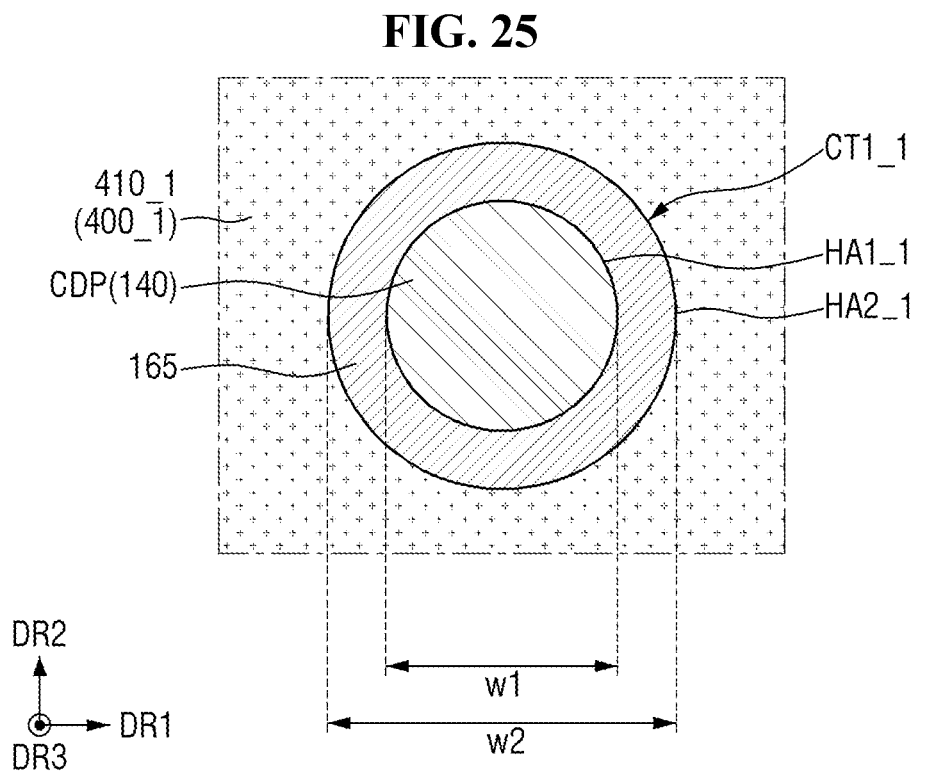

FIG. 24 is a cross-sectional view of a display device according to another embodiment of the present disclosure, and FIG. 25 is a plan view showing a layout of a peripheral area around a first opening and a second opening forming a first electrode contact opening shown in FIG. 24.

The embodiment shown in FIGS. 24 and 25 is different from the embodiment shown in FIGS. 5 and 6 in that each of first and second electrode contact openings CT1_1 and CT2_1 of a display device 10 has a first opening HA1_1 and a second opening HA2_1 having different diameters (or widths) from each other.

As described above, the diameter (or width) W1 of the first opening HA1_1 and the diameter (or width) W2 of the second opening HA2_1 may be measured at the same level. For example, the diameter W1 of the first opening HA1_1 and the diameter W2 of the second opening HA2_1 may be measured as the diameters at the same level with the upper surface of the first organic planarization layer 165 or the lower surface of the second organic planarization layer 410.

For example, the diameter W1 of the first opening HA1_1 may be different from the diameter W2 of the second opening HA2_1. According to this embodiment, the diameter W1 of the first opening HA1_1 may be smaller than the diameter W2 of the second opening HA2_1. Accordingly, the second opening HA2_1 may completely overlap the first opening HA1_1 in the third direction DR3, which is the thickness direction of the substrate SUB. Accordingly, the sidewalls 410SS_1 of the second organic planarization layer 410_1 forming the second opening HA2_1 may be aligned more to the inside than the sidewalls 165SS of the first organic planarization layer 165 forming the first opening HA1_1 and may be disposed on the upper surface of the first organic planarization layer 165.

Because the diameter W1 of the first opening HA1_1 is smaller than the diameter W2 of the second opening HA2_1, the second opening HA2_1 may expose a part of the upper surface of the first organic planarization layer 165. Accordingly, the first electrode 210 and the second electrode 220 electrically connected to the third conductive layer 140 thereunder through the first electrode contact opening CT1_1 and the second electrode contact opening CT2_1 may further contact the part of the upper surface of the first organic planarization layer that is exposed by the second opening HA2_1.

Figure 26:
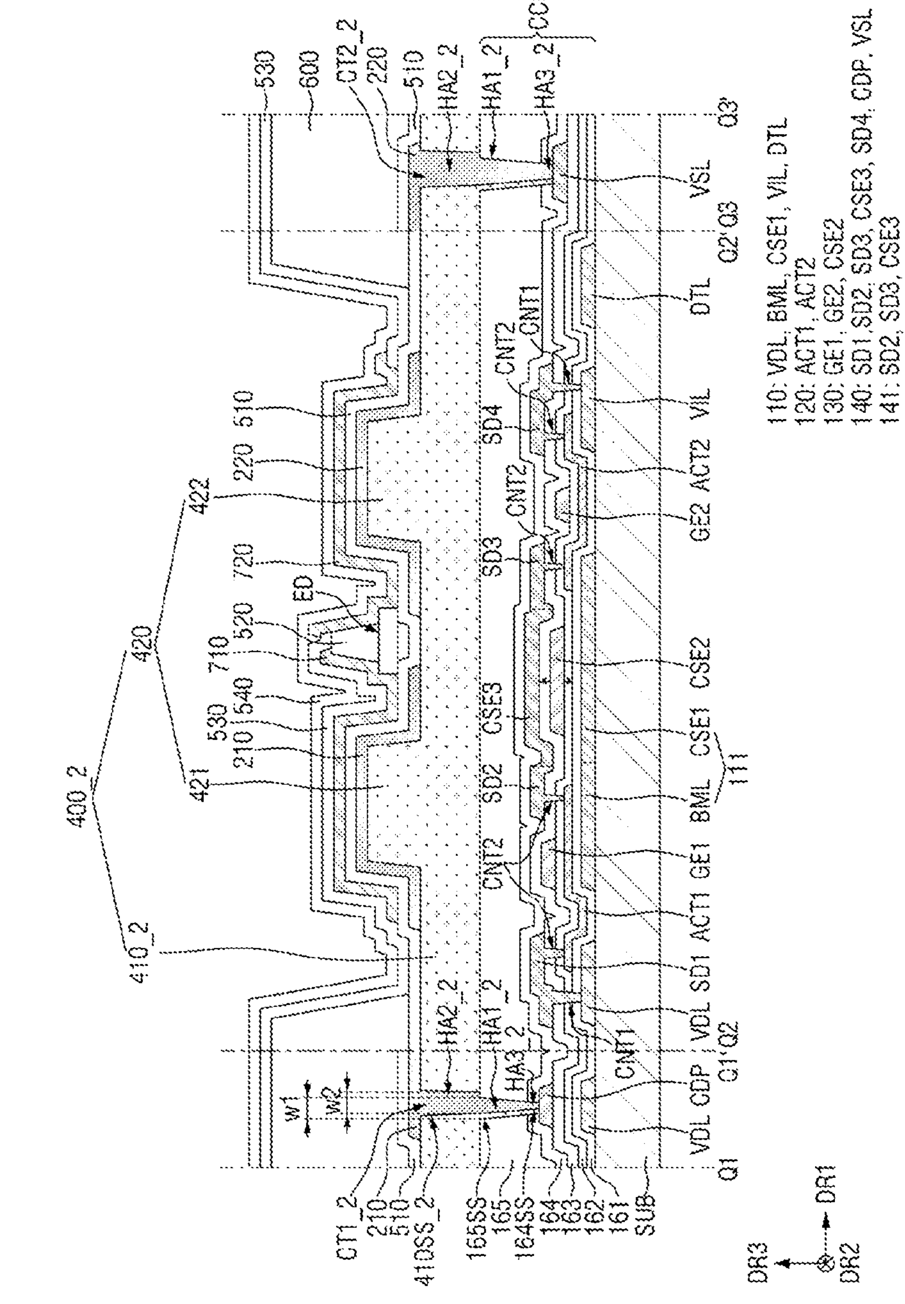
FIG. 26 is a cross-sectional view of a display device according to another embodiment of the present disclosure.
Figure 27:
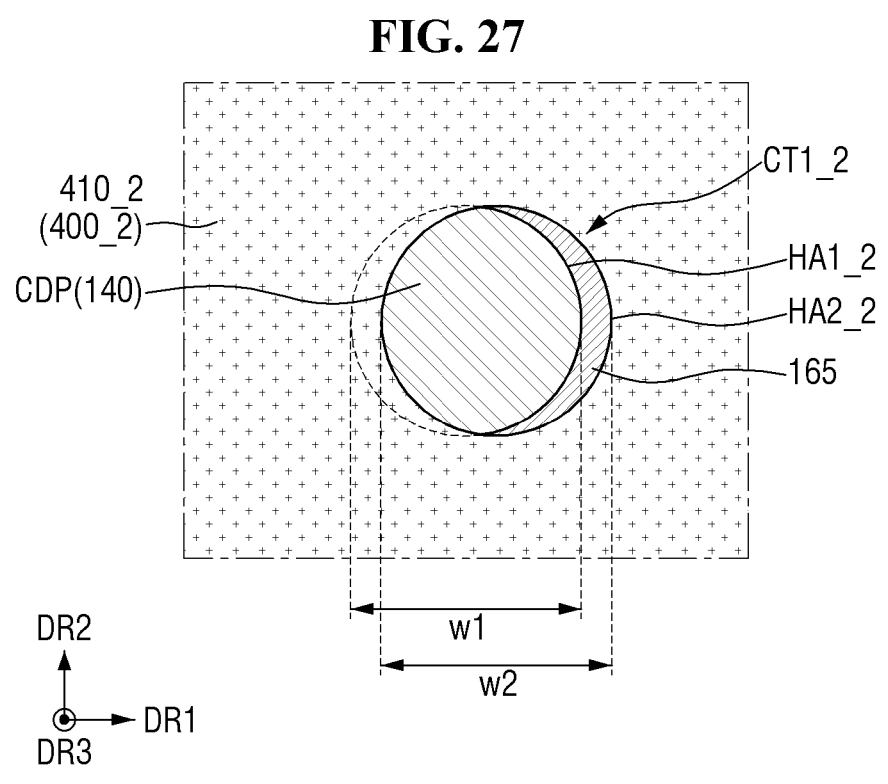

FIG. 26 is a cross-sectional view of a display device according to another embodiment of the present disclosure, and FIG. 27 is a plan view showing a layout of a peripheral area around a first opening and a second opening forming a first electrode contact opening shown in FIG. 26.

The embodiment shown in FIGS. 26 and 27 is different from the embodiment shown in FIGS. 5 and 6 in that first and second electrode contact openings CT1_2 and CT2_2 have the same diameter (or width) and that a first opening HA1_1 and a second opening HA2_1 forming each of the first and second electrode contact openings CT1_2 and CT2_2 are partially deviated (or offset) from each other when viewed from the top.

For example, the diameter (or width) W1 of the first opening HA1_2 may be equal (or substantially equal) to the diameter (or width) W2 of the second opening HA2_2. The second opening HA2_2 may overlap a part of the first opening HA1_2 in the third direction DR3 but may be deviated (or offset) toward one side thereof in the first direction DR1. Accordingly, one sidewall 410SS_2 of a second organic planarization layer 410_2 forming the second opening HA2_2 may cover the sidewall 165SS of the first organic planarization layer 165 forming the first opening HA1_2 and the sidewall 164SS of the passivation layer 164 forming the third opening HA3_2 in a cross section, and the other sidewall 410SS_2 of the second organic flat layer 410_2 forming the second opening HA2_2 may be aligned more to the inside than the sidewall 165SS of the first organic planarization layer 165 forming the first opening HA1_2 and the sidewall 164SS of the passivation layer 164 forming the third opening HA3_2. For example, a part of the sidewall 410SS_2 of the second organic planarization layer 410_2 may be aligned more to the outside than the sidewall 165SS of the first organic planarization layer 165, and another part of the sidewall 410SS_2 of the second organic planarization layer 410_2 may be aligned more to the inside than the sidewall 165SS of the first organic planarization layer 165 to be disposed on the upper surface of the first organic planarization layer 165. Because one sidewall 410SS_2 of the second organic planarization layer 410_2 may be disposed to cover the sidewall 165SS of the first organic planarization layer 165 forming the first opening HA1_2 and the sidewall 164SS of the passivation layer 164 forming the third opening HA3_2, the the second organic planarization layer 410_2 may cover the upper surface and the sidewall 165SS of the first organic planarization layer 165 and the sidewall 164SS of the passivation layer 164 on one side.

Figure 28:
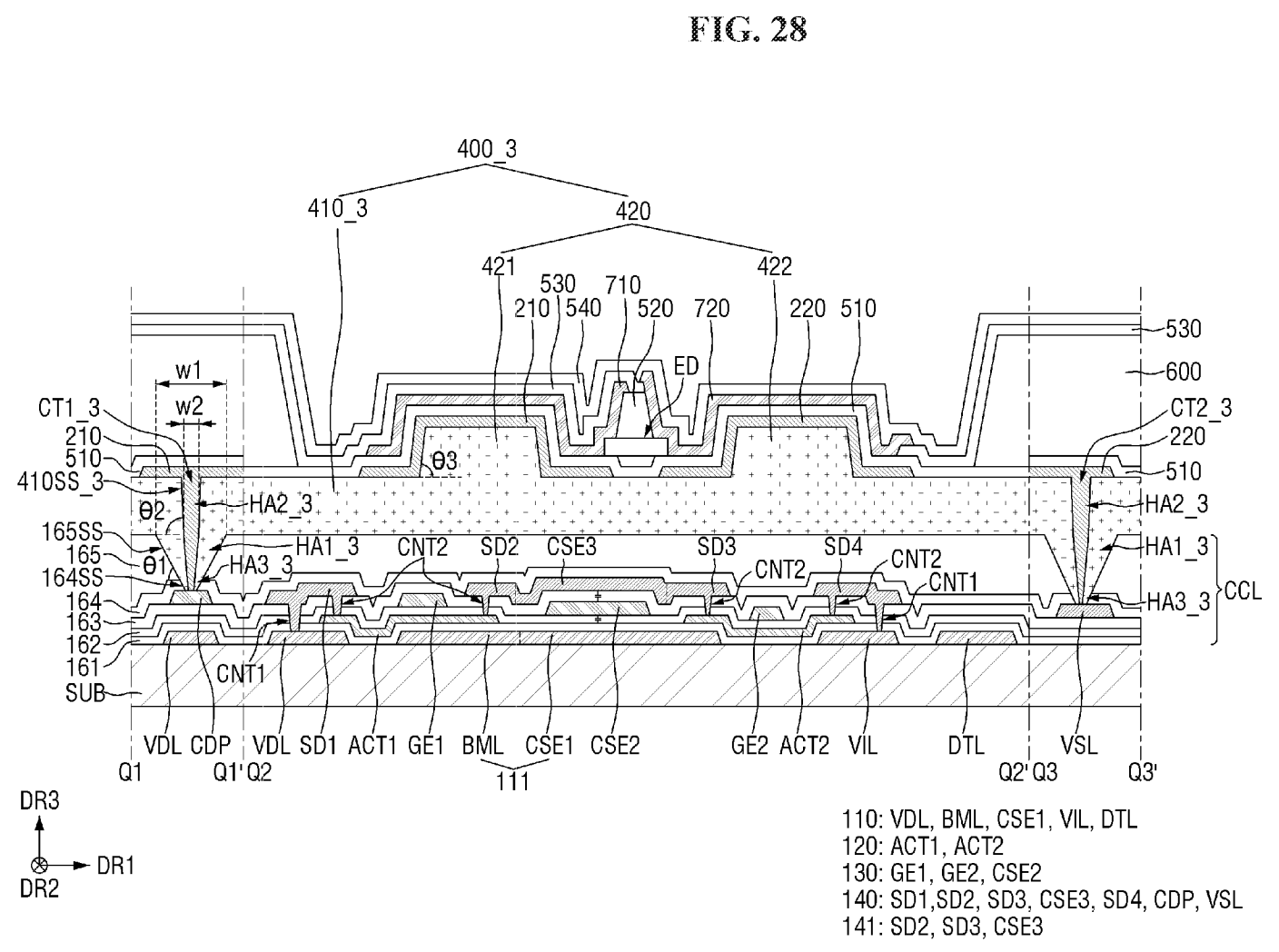
Figure 29:
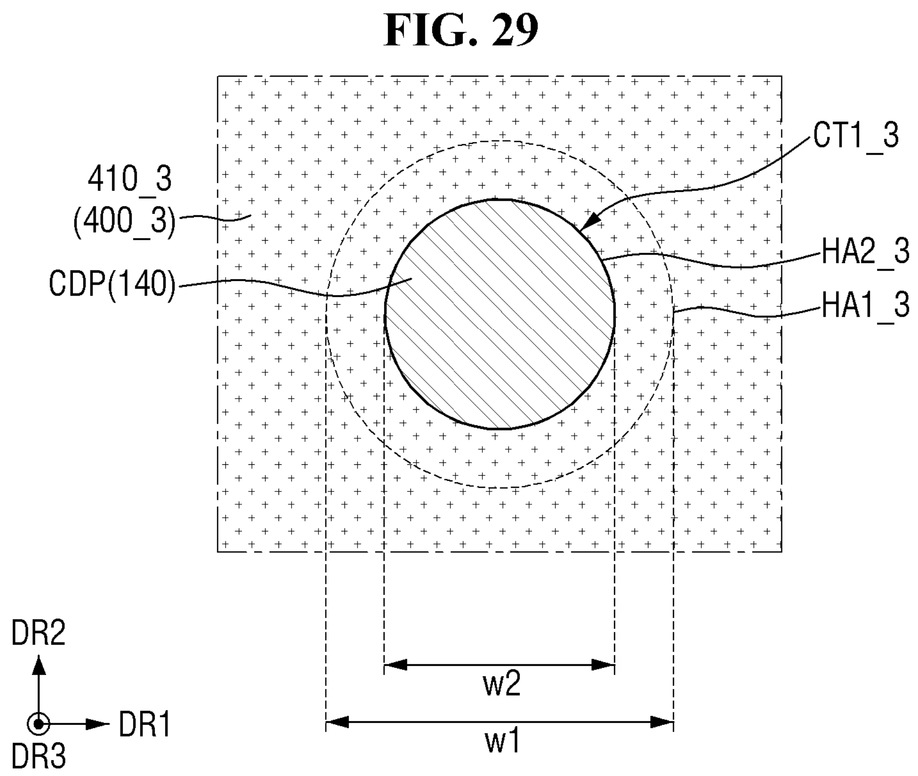
FIG. 29 is a plan view showing a layout of a peripheral area around a first opening and a second opening forming a first electrode contact opening shown in FIG. 28.

FIG. 28 is a cross-sectional view of a display device according to another embodiment of the present disclosure, and FIG. 29 is a plan view showing a layout of a peripheral area around a first opening and a second opening forming a first electrode contact opening shown in FIG. 28.

The embodiment shown in FIGS. 28 and 29 is different from the embodiment shown in FIGS. 5 and 6 in that each of first and second electrode contact opening CT1_3 and CT2_3 is formed of a second opening HA2_3 and that the diameter (or width) W1 of a first opening HA1_3 is greater than the diameter (or width) W2 of a second opening HA2_3.

For example, the diameter W1 of the first opening HA1_3 may be greater than the diameter W2 of the second opening HA2_3. Accordingly, the sidewalls 410SS_3 of a second organic planarization layer 410_3 forming the second opening HA2_3 may be aligned more to the outside than the sidewalls 165SS of the first organic planarization layer 165 forming the first opening HA1_3.

Because the diameter W1 of the first opening HA1_3 is larger than the diameter W2 of the second opening HA2_3, the second organic planarization layer 410_3 may be disposed to cover sidewalls 165SS of the first organic planarization layer 165 and the sidewalls 164SS of the passivation layer 164. In addition, the second organic planarization layer 410_3 may completely cover the upper surface and sidewalls 165SS of the first organic planarization layer 165 forming the first opening HA1_3 and the sidewalls 164SS of the passivation layer 164 forming the third opening HA3.

According to this embodiment, each of the first and second electrode contact openings CT1_3 and CT2_3 may be identical (or substantially identical) to the second opening HA2_3 formed of the sidewalls 410SS_3 of the second organic planarization layer 410_3. Accordingly, the first electrode 210 and the second electrode 220 electrically connected to the third conductive layer 140 thereunder through the first electrode contact opening CT1_1 and the second electrode contact opening CT2_1 may contact the sidewalls 410SS_3 of the second organic planarization layer 410_3 forming the second opening HA2_1 and may contact neither the sidewalls 165SS of the first organic planarization layer 165 nor the sidewalls 164SS of the passivation layer 164.

The first inclination angle θ1 of the sidewalls 164SS of the sidewalls 164SS of the passivation layer 164 and the sidewalls 165SS of the first organic planarization layer 165 forming the first opening HA1_3 may be different from the second inclination angle θ2 of the sidewalls 410SS_3 of the second organic planarization layer 410_3 forming the second opening HA2_3. According to an embodiment of the present disclosure, because the organic layer 410 includes a high-angle organic material, the second inclination angle θ2 of the sidewalls 410SS_3 of the second organic planarization layer 410_3 may be larger the first inclination angle θ1 of the sidewalls 165SS of the first organic planarization layer 165. In addition, the second inclination angle θ2 of the sidewalls 410SS_3 of the second organic planarization layer 410_3 formed via the same process may be equal (or substantially equal) to the third inclination angle θ3 of the sidewalls of the first bank 420. For example, the first inclination angle θ1 may be in a range of less than about 60°, and in one embodiment, may be in a range of about 45° or less. In addition, the second and third inclination angles θ2 and θ3 may each be in a range of about 60° or more.

Figure 30:
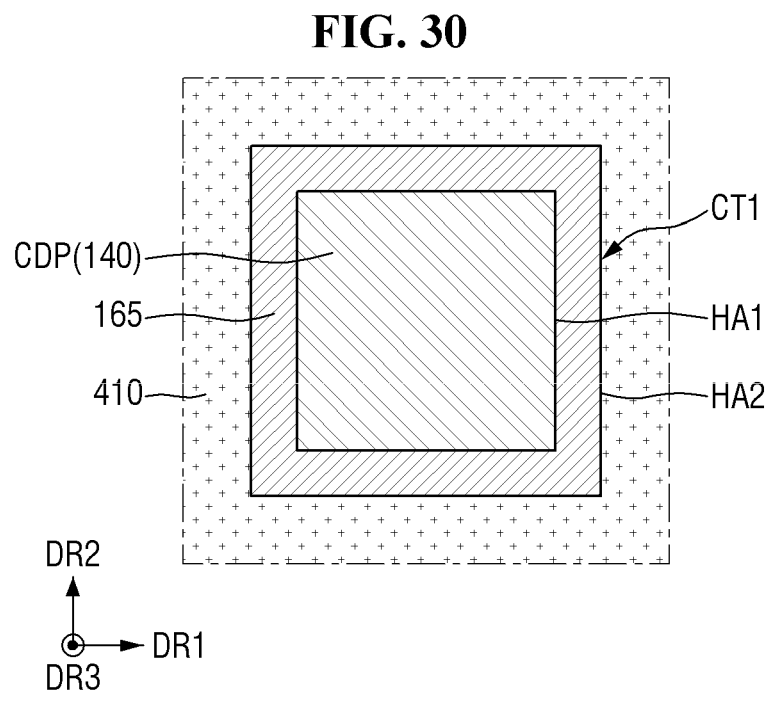
Figure 31:
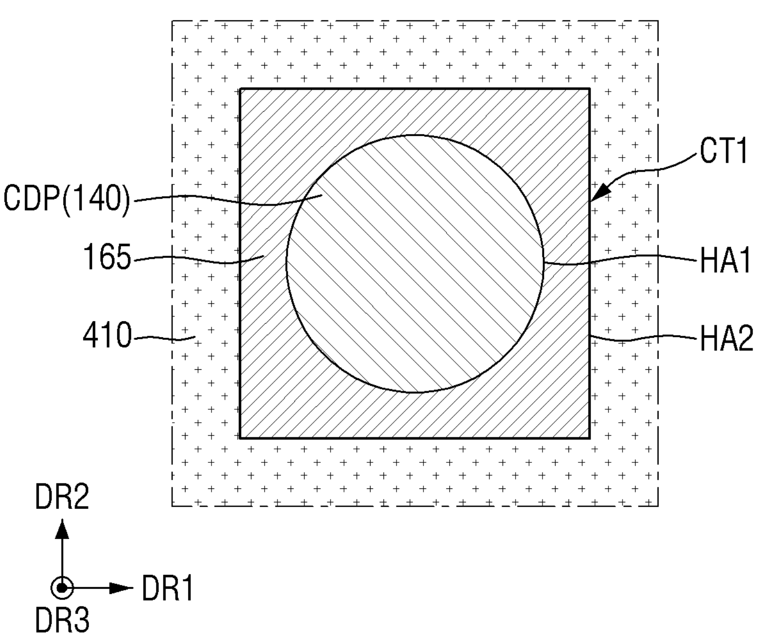
FIG. 31 is a plan view showing a layout of a peripheral area around a first opening and a second opening forming a first electrode contact opening according to another embodiment.

FIG. 30 is a plan view showing a layout of a peripheral area around a first opening and a second opening forming a first electrode contact opening according to another embodiment. FIG. 31 is a plan view showing a layout of a peripheral area around a first opening and a second opening forming a first electrode contact opening according to another embodiment. FIGS. 30 and 31 show various planar structures of the first opening HA1 and the second opening HA2.

Referring to FIG. 30, the first opening HA1 and the second opening HA2 may have a similar shape when viewed from the top. For example, the first opening HA1 and the second opening HA2 may have a rectangular shape when viewed from the top. Although the size of the first opening HA1 is smaller than the size of the second opening HA2 when viewed from the top in the drawings, the present disclosure is not limited thereto. For example, the size of the first opening HA1 may be equal (or substantially equal) to the size of the second opening HA2 when viewed from the top, or the size of the first opening HA1 may be larger than the size of the second opening HA2.

Subsequently, referring to FIG. 31, the first opening HA1 and the second opening HA2 may have different shapes when viewed from the top. For example, the first opening HA1 may have a circular shape while the second opening HA2 may have a rectangular shape when viewed from the top. Even when the shape of the first opening HA1 and the shape of the second opening HA2 are different from each other when viewed from the top, the size of the first opening HA1 and the size of the second opening HA2 when viewed from the top may be variously modified.

In concluding the detailed description, those skilled in the art will appreciate that many variations and modifications can be made to the embodiments described herein without substantially departing from the aspects and features of the present disclosure. Therefore, the disclosed embodiments of the present disclosure are used in a generic and descriptive sense and not for purposes of limitation.

What is claimed is:

1. A display device comprising:

a substrate;

a first conductive layer on a surface of the substrate and comprising a conductive pattern electrically connected to a first transistor;

a first organic planarization layer on the first conductive layer;

an organic layer on the first organic planarization layer, the organic layer comprising a first bank having a first height and a second organic planarization layer having a second height lower than the first height, the first bank comprising a first sub-bank and a second sub-bank spaced apart from each other;

a first electrode on the organic layer;

a second electrode on the organic layer and spaced apart from the first electrode;

a light-emitting element on the organic layer, between the first electrode and the second electrode, and between the first sub-bank and the second sub-bank; and a second bank on the organic layer, spaced apart from the first bank in a direction along the surface of the substrate, and having a height greater than the first bank, wherein the first organic planarization layer has a first opening exposing the conductive pattern therethrough, wherein the second organic planarization layer has a second opening open to the first opening and exposing the conductive pattern therethrough, wherein a diameter or width of the second opening at where it is open to the first opening is the same as a diameter or width of the first opening at where it is open to the second opening, and wherein sidewalls of the first organic planarization layer defining the first opening and sidewalls of the second organic planarization layer defining the second opening are not aligned in line with each other, wherein the second bank overlaps the first opening in a thickness direction perpendicular to the surface of the substrate, and wherein the second bank overlaps the second opening in the thickness direction.

2. The display device of claim 1, wherein the second opening overlaps at least a part of the first opening in the thickness direction.

3. The display device of claim 2, wherein a diameter or width of the second opening is smaller than a diameter or width of the first opening.

4. The display device of claim 3, wherein the second organic planarization layer covers the sidewalls of the first organic planarization layer defining the first opening and an upper surface of the first organic planarization layer.

5. The display device of claim 3, wherein an inclination angle of the sidewalls of the second organic planarization layer defining the second opening is greater than an inclination angle of the sidewalls of the first organic planarization layer defining the first opening.

6. The display device of claim 3, wherein the first electrode is electrically connected to the conductive pattern through the second opening.

7. The display device of claim 2, wherein a diameter or width of the second opening is larger than a diameter or width of the first opening.

8. The display device of claim 7, wherein the sidewalls of the second organic planarization layer defining the second opening are on an upper surface of the first organic planarization layer.

9. The display device of claim 7, wherein the first electrode is electrically connected to the conductive pattern through the first opening and the second opening.

10. The display device of claim 7, wherein the second opening exposes the first opening and a part of an upper surface of the first organic planarization layer.

11. The display device of claim 1, wherein the second opening deviates from the first opening in a direction when viewed from top.

12. The display device of claim 1, wherein an inclination angle of the sidewalls of the first organic planarization layer defining the first opening is different from an inclination angle of the sidewalls of the second organic planarization layer defining the second opening.

13. The display device of claim 1, wherein the first electrode is electrically connected to the conductive pattern through an electrode contact opening exposing the conductive pattern.

14. The display device of claim 13, wherein the electrode contact opening is formed by the first opening or the second opening.

15. The display device of claim 1, wherein the organic layer is directly on an upper surface of the first organic planarization layer.

16. The display device of claim 1, further comprising a passivation layer on the first organic planarization layer and having a third opening exposing the conductive pattern, wherein the organic layer is on the passivation layer.

17. The display device of claim 16, wherein sidewalls of the passivation layer defining the third opening are aligned in line with the sidewalls of the first organic planarization layer defining the first opening.

18. The display device of claim 1, further comprising:

a second conductive layer on the substrate and comprising a first capacitor electrode;

a buffer layer on the second conductive layer;

a third conductive layer on the buffer layer and comprising a second capacitor electrode overlapping the first capacitor electrode in a thickness direction of the substrate; and an interlayer insulating film on the third conductive layer, wherein the first conductive layer is on the interlayer insulating film, and wherein the first conductive layer further comprises a third capacitor electrode overlapping the first capacitor electrode and the second capacitor electrode in the thickness direction.

19. The display device of claim 18, wherein the first organic planarization layer and the second organic planarization layer are interposed between the first electrode and the third capacitor electrode.

* * * * *